US008546698B2

(12) United States Patent
Naganuma

(10) Patent No.: US 8,546,698 B2
(45) Date of Patent: Oct. 1, 2013

(54) WIRING BOARD AND METHOD FOR MANUFACTURING THE SAME

(75) Inventor: Nobuyuki Naganuma, Ogaki (JP)

(73) Assignee: Ibiden Co., Ltd., Ogaki-shi (JP)

(*) Notice: Subject to any disclaimer, the term of this patent is extended or adjusted under 35 U.S.C. 154(b) by 468 days.

(21) Appl. No.: 12/793,720

(22) Filed: Jun. 4, 2010

(65) Prior Publication Data

US 2011/0100680 A1 May 5, 2011

Related U.S. Application Data

(60) Provisional application No. 61/256,367, filed on Oct. 30, 2009.

(51) Int. Cl.
*H05K 1/03* (2006.01)

(52) U.S. Cl.
USPC ............................. 174/255; 174/262; 174/264

(58) Field of Classification Search
USPC ................ 174/250–268; 361/748, 749, 760, 361/777, 792–795
See application file for complete search history.

(56) References Cited

U.S. PATENT DOCUMENTS

| 6,281,446 | B1 | 8/2001 | Sakamoto et al. | |
|---|---|---|---|---|
| 7,417,195 | B2 * | 8/2008 | Totani et al. | 174/255 |
| 7,525,816 | B2 * | 4/2009 | Sawachi | 361/792 |
| 7,808,799 | B2 * | 10/2010 | Kawabe et al. | 361/765 |
| 2002/0020554 | A1 | 2/2002 | Sakamoto et al. | |
| 2007/0281394 | A1 | 12/2007 | Kawabe et al. | |

FOREIGN PATENT DOCUMENTS

| JP | 58-105587 | 6/1983 |
|---|---|---|
| JP | 1-183196 | 7/1989 |
| JP | 10-284632 | 10/1998 |
| JP | 11-317582 | 11/1999 |
| JP | 2000-91752 | 3/2000 |
| JP | 2003-69229 | 3/2003 |
| JP | 2003-218523 | 7/2003 |
| JP | 2003-298234 | 10/2003 |
| JP | 2004-87786 | 3/2004 |
| JP | 2007-318090 | 12/2007 |
| TW | 200847363 | 12/2008 |
| WO | WO 2011/003123 A1 | 1/2011 |

OTHER PUBLICATIONS

U.S. Appl. No. 12/795,737, filed Jun. 8, 2010, Naganuma.

* cited by examiner

*Primary Examiner* — Ishwarbhai Patel
(74) *Attorney, Agent, or Firm* — Oblon, Spivak, McClelland, Maier & Neustadt, L.L.P.

(57) ABSTRACT

A wiring board has a first rigid wiring board having a first wiring layer on a first main surface, a second rigid wiring board having a second wiring layer on a second main surface, a first connection portion connecting the first wiring layer and the second wiring layer, and a first interlayer insulation layer formed on the first wiring layer, the second wiring layer and the first connection portion. In such a wiring board, the first rigid wiring board and the second rigid wiring board are positioned in such a way that the first main surface and the second main surface are set at substantially the same level, and the first wiring layer and the second wiring layer are electrically connected by the first connection portion.

20 Claims, 27 Drawing Sheets

WIRING BOARD AND METHOD FOR MANUFACTURING THE SAME

CROSS-REFERENCE TO RELATED APPLICATIONS

The present application claims the benefits of priority to U.S. Application No. 61/256,367, filed Oct. 30, 2009. The contents of that application are incorporated herein by reference in their entirety.

BACKGROUND OF THE INVENTION

1. Field of the Invention

The present invention relates to a wiring board and its manufacturing method.

2. Discussion of the Background

In Japanese Laid-Open Patent Publication 2003-298234, a multilayer wiring board partially having a region with high wiring density is described. In such a wiring board, a second wiring board is adhered on a first wiring board, and the wiring of the first wiring board and the wiring of the second wiring board are electrically connected. The contents of Japanese Laid-Open Patent Application No. 2003-298234 are incorporated herein by reference in their entirety in the present application.

SUMMARY OF THE INVENTION

A wiring board according to one aspect of the present invention has a first rigid wiring board having a first wiring layer on a first main surface, a second rigid wiring board having a second wiring layer on a second main surface, a first connection portion connecting the first wiring layer and the second wiring layer, and a first interlayer insulation layer formed on the first wiring layer, the second wiring layer and the first connection portion. In such a wiring board, the first rigid wiring board and the second rigid wiring board are positioned in such a way that the first main surface and the second main surface are set at substantially the same level, and the first wiring layer and the second wiring layer are electrically connected by the first connection portion.

A method for manufacturing a wiring board according to another aspect of the present invention includes the following: preparing a first intermediate substrate before a first wiring layer is formed on a first main surface of a first rigid wiring board, and a second intermediate substrate before a second wiring layer is formed on a second main surface of a second rigid wiring board; positioning the second intermediate substrate in an accommodation space prepared in the first intermediate substrate in such a way that the first main surface and the second main surface are set at substantially the same level; forming a wiring layer which is contiguous from either the first main surface or the second main surface to the other and includes the first wiring layer and the second wiring layer; and forming an interlayer insulation layer on the first main surface and on the second main surface and forming an upper-layer wiring layer on the interlayer insulation layer.

A method for manufacturing a wiring board according to yet another aspect of the present invention includes the following: preparing a first rigid wiring board having a first wiring layer on a first main surface, and a second rigid wiring board having a second wiring layer on a second main surface; positioning the second rigid wiring board in an accommodation space prepared in the first rigid wiring board in such a way that the first main surface and the second main surface are set at substantially the same level; electrically connecting the first wiring layer and the second wiring layer by means of a conductive paste; and forming an interlayer insulation layer on the first main surface and on the second main surface and forming an upper-layer wiring layer on the interlayer insulation layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
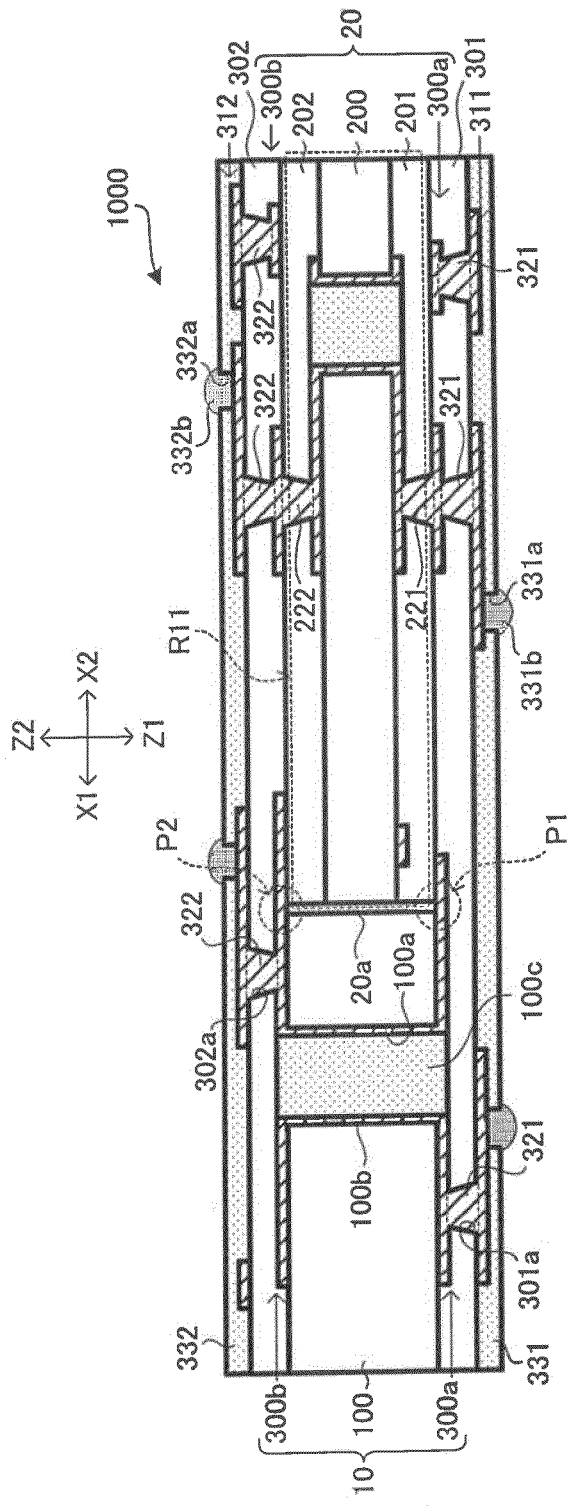
FIG. 1 is a cross-sectional view showing a schematic structure of a wiring board relating to the first embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction in a wiring board, corresponding to a direction along a normal line (or a direction of the thickness of a core substrate) to the main surfaces (upper and lower surfaces) of the wiring board. On the other hand, arrows (X1, X2) and (Y1, Y2) each indicate a direction perpendicular to a lamination direction (directions parallel to the main surfaces of the wiring board). The main surfaces of a wiring board are on the X-Y plane. Side surfaces of a wiring board are on the X-Z plane or the Y-Z plane.

In the description of an embodiment, two main surfaces facing opposite normal lines are referred to as a first surface (the surface on the arrow-Z1 side) and a second surface (the surface on the arrow-Z2 side). Namely, a main surface opposite the first surface is the second surface and a main surface opposite the second surface is the first surface. In the lamination directions, a side closer to the core is referred to as a lower layer (or an inner-layer side) and a side farther from the core is referred to as an upper layer (or an outer-layer side). An outer layer indicates a layer positioned uppermost (uppermost layer) and an inner layer indicates a layer positioned lower than the outer layer (a layer other than the uppermost layer). A layer including a conductive pattern which functions as wiring for circuits or the like is referred to as a wiring layer. A wiring layer may include a through-hole conductor or a land of a via conductor other than a conductive pattern described above. A conductor which is formed in a through hole and electrically connects wiring layers on both surfaces of a substrate to each other is referred to as a through-hole conductor. A conductor which is formed in a via hole and electrically connects an upper-layer wiring layer and a lower-layer wiring layer to each other is referred to as a via conductor.

First Embodiment

As shown in FIG. 1, wiring board 1000 of the present embodiment has first rigid wiring board 10 and second rigid wiring board 20. First rigid wiring board 10 and second rigid wiring board 20 correspond to a core substrate of wiring board 1000. The conductor density of first rigid wiring board 10 is less than that of second rigid wiring board 20. Regarding first rigid wiring board 10 and second rigid wiring board 20, when comparing the numbers of their wiring layers in terms of unit thickness, the total number of wiring layers in second rigid wiring board 20 is greater than the total number of wiring layers in first rigid wiring board 10. In the present embodiment, due to such a difference in the numbers of their wiring layers, the existing density of conductors in second rigid wiring board 20 is greater than the existing density of conductors in first rigid wiring board 10. Wiring board 1000, first rigid wiring board 10 and second rigid wiring board 20 are each printed wiring boards. Especially, second rigid wiring board 20 is a multilayer wiring board having multiple wiring layers.

First rigid wiring board 10 and second rigid wiring board 20 have shared wiring layers (300a, 300b) on their main surfaces (first surface and second surface). Wiring layers (300a, 300b) each are a single wiring layer formed contiguously from either first rigid wiring board 10 or second rigid wiring board 20 to the other. First rigid wiring board 10 and second rigid wiring board 20 are electrically connected in inner layers (connection portions (P1, P2)) of wiring board 1000 by means of wiring layers (300a, 300b). Connection portion (P1) (second connection portion) is formed with wiring layer (300a), and connection portion (P2) (first connection portion) is formed with wiring layer (300b). Namely, first rigid wiring board 10 and second rigid wiring board 20 are electrically connected at connection portion (P1) on the first-surface side by contiguous wiring layer (300a). Also, first rigid wiring board 10 and second rigid wiring board 20 are electrically connected as well at connection portion (P2) on the second-surface side by contiguous wiring layer (300b). Wiring layers (300a, 300b) are made of copper, for example.

Figure 2:
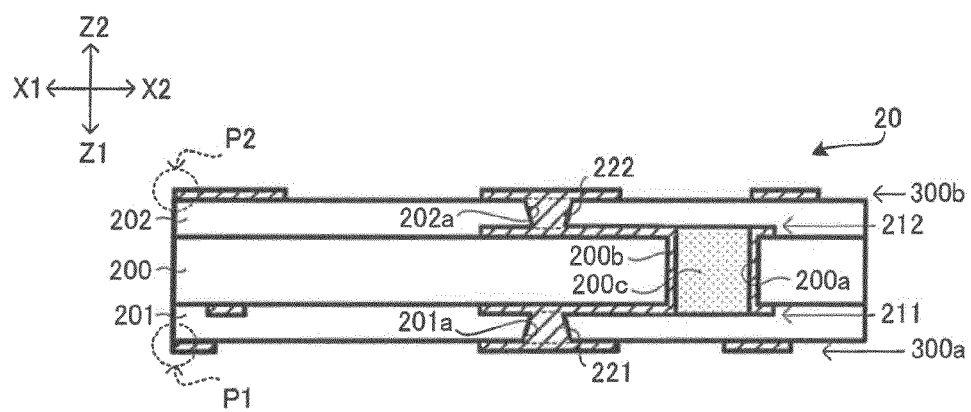
FIG. 2 is a cross-sectional view showing a schematic structure of a second rigid wiring board.

As shown in FIG. 2, second rigid wiring board 20 has substrate 200, insulation layers (201, 202), wiring layers (211, 212), via conductors (221, 222) and wiring layers (300a, 300b). Wiring layer (300a) (fourth wiring layer) is formed on the first surface (fourth main surface) of second rigid wiring board 20, and wiring layer (300b) (second wiring layer) is formed on the second surface (second main surface) of second rigid wiring board 20. Via conductors (221, 222) are filled vias. Wiring layers (211, 212) and via conductors (221, 222) are made of copper, for example. Also, insulation layers (201, 202) work as interlayer insulation layers. Insulation layers (201, 202) are made of cured prepreg, for example. As for prepreg, the following is used, for example: base material such as glass fiber or aramid fiber impregnated with resin such as epoxy resin, polyester resin, bismaleimide triazine resin (BT resin), imide resin (polyimide), phenol resin or allyl polyphenylene ether resin (A-PPE resin).

Substrate 200 is made of epoxy resin, for example. Epoxy resin is preferred to contain reinforcing material such as glass fiber or aramid fiber, impregnated with resin, for example. Reinforcing material is such material that has a smaller thermal expansion coefficient than the primary material (epoxy resin). As for reinforcing material, inorganic material, such as glass cloth, silica filler or glass filler, is preferred.

Wiring layer 211 is formed on the first surface of substrate 200, and wiring layer 212 is formed on the second surface of substrate 200. Through hole (200a) is formed in substrate 200. On the wall surface of through hole (200a), through-hole conductor (200b) is formed. Through-hole conductor (200b) electrically connects wiring layer 211 and wiring layer 212 to each other. In through hole (200a), resin (200c) spilled out from insulation layers (201, 202), for example, is filled. The wiring board, which is formed with substrate 200, wiring layers (211, 212) and through-hole conductor (200b), corresponds to the core substrate of second rigid wiring board 20.

Insulation layer 201 is formed on the first surface of substrate 200, and insulation layer 202 is formed on the second surface of substrate 200. Wiring layer (300a) is formed on insulation layer 201, and wiring layer (300b) is formed on insulation layer 202. Via hole (201a) is formed in insulation layer 201, and via hole (202a) is formed in insulation layer 202. In via holes (201a, 202a), a conductor (such as copper) is filled through plating, for example, to form via conductors (221, 222) respectively. Wiring layer 211 and wiring layer (300a) are electrically connected to each other by means of via conductor 221, and wiring layer 212 and wiring layer (300b) are electrically connected to each other by means of via conductor 222.

Figure 3:
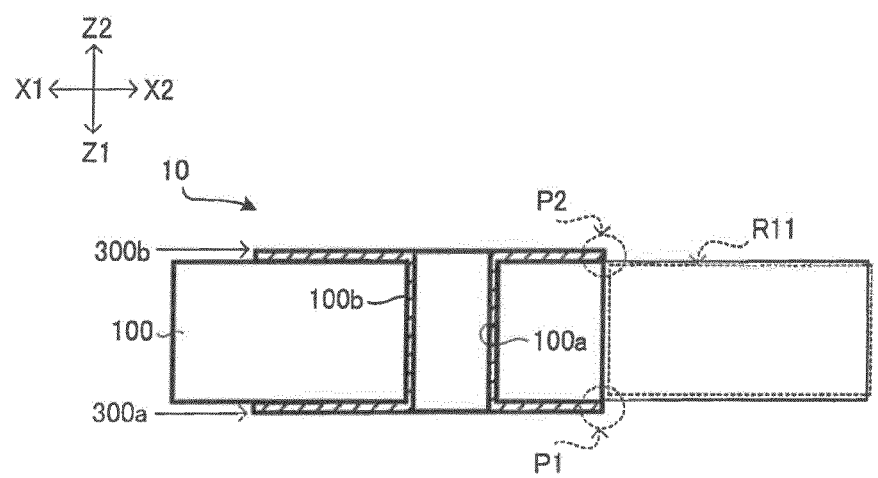
FIG. 3 is a cross-sectional view showing a schematic structure of a first rigid wiring board.

As shown in FIG. 3, first rigid wiring board 10 has substrate 100 and wiring layers (300a, 300b). Wiring layer (300a) (third wiring layer) is formed on the first surface (third main surface) of first rigid wiring board 10, and wiring layer (300b) (first wiring layer) is formed on the second surface (first main surface) of first rigid wiring board 10. Through hole (100a) is formed in substrate 100. On the wall surface of through hole (100a), through-hole conductor (100b) is formed. Through-hole conductor (100b) electrically connects wiring layer (300a) and wiring layer (300b) to each other.

Substrate 100 is made of epoxy resin, for example. Epoxy resin is preferred to contain reinforcing material such as glass fiber or aramid fiber impregnated with resin, for example. Reinforcing material is such material that has a smaller thermal expansion coefficient than the primary material (epoxy resin). As for reinforcing material, inorganic material, such as glass cloth, silica filler or glass filler, is preferred.

Figure 4:
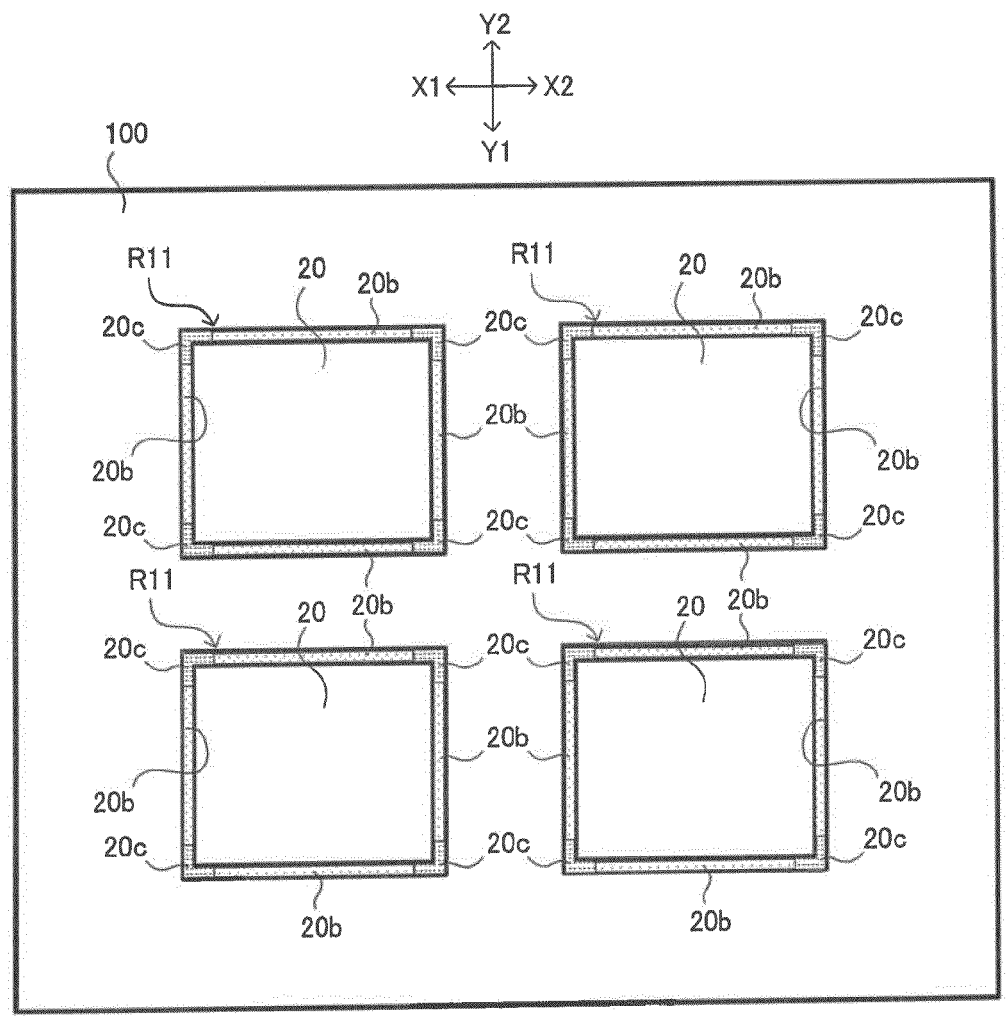
FIG. 4 is a plan view showing positions of second rigid wiring boards (#1)

As shown in FIG. 4, penetrating holes (20b) are formed in substrate 100. Such penetrating holes (20b) become accommodation spaces (R11) (accommodation sections). As shown in FIG. 1, second rigid wiring board 20 is accommodated in accommodation space (R11) prepared in first rigid wiring board 10 (substrate 100).

Substrate 100 and second rigid wiring boards 20 are positioned to be set along directions X or directions Y, as shown in FIG. 4. FIG. 4 shows an example in which multiple (such as four) rectangular accommodation spaces (R11) are formed in a single rectangular first rigid wiring board 10, and then rectangular second rigid wiring board 20 is accommodated in each accommodation space (R11). However, the present embodiment is not limited to such. The number, shape and so forth of first rigid wiring board 10 and second rigid wiring board 20 may be determined freely.

In the clearance between first rigid wiring board 10 and second rigid wiring board 20, resin (20a) spilled out from insulation layers (301, 302) is filled. However, as shown in FIG. 4, adhesive agent (20c) for preliminary fixing is filled in the clearances in the four corners of second rigid wiring board 20. Adhesive agent (20c) may be a photocurable adhesive agent such as a UV-curable adhesive agent, a thermosetting adhesive agent such as an epoxy adhesive agent or other adhesive agent such as two-pack adhesives. Alternatively, two or more kinds of adhesive agents may be used. Thermosetting adhesive agents generally have stronger adhesiveness than photocurable adhesive agents.

Figure 5:
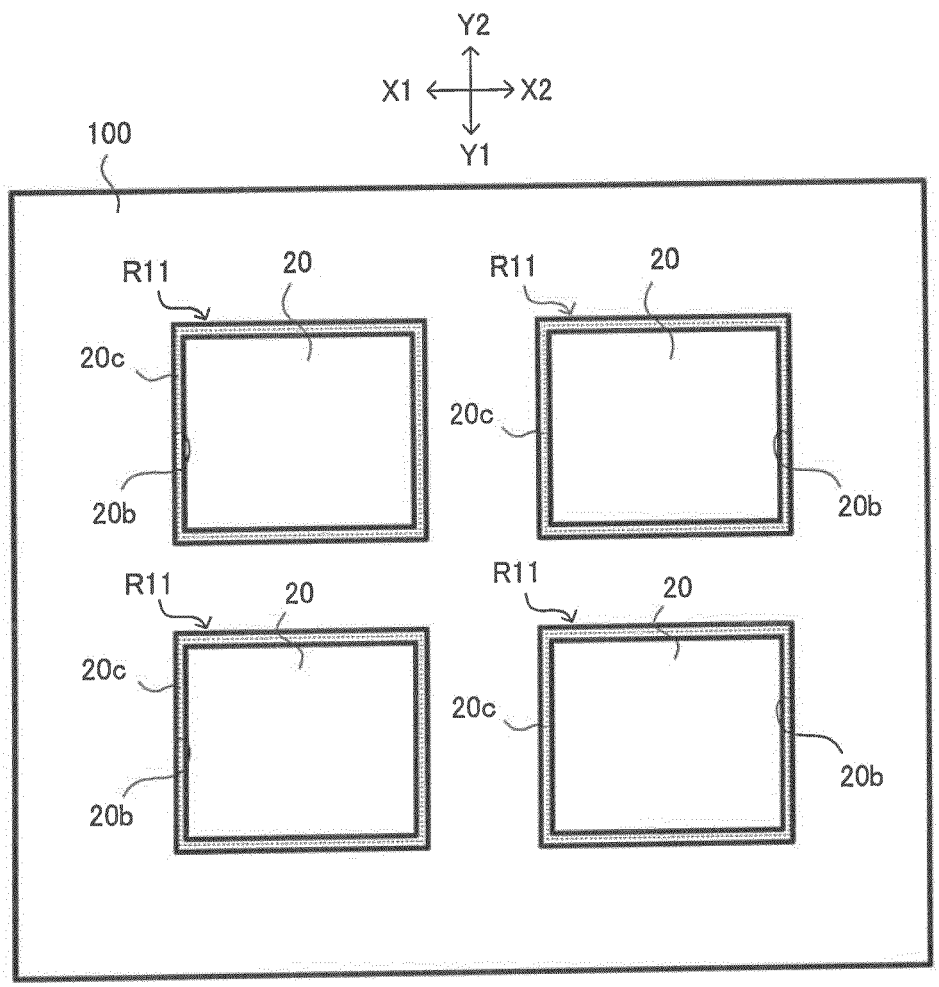
FIG. 5 is a plan view showing positions of second rigid wiring boards (#2)

Areas for adhesive agent (20c) to be filled are not limited to four corners shown in FIG. 4. For example, as shown in FIG. 5, adhesive agent (20c) may be filled in the entire clearance between first rigid wiring board 10 and second rigid wiring board 20.

The thickness of substrate 100 is substantially the same as the sum of the thicknesses of substrate 200 and insulation layers (201, 202) as shown in FIG. 1. Accordingly, the first surface of first rigid wiring board 10 and the first surface of second rigid wiring board 20, as well as the second surface of first rigid wiring board 10 and the second surface of second rigid wiring board 20, are set at substantially the same level and their boundaries become substantially flat. In addition, parts of wiring layers (300a, 300b) are positioned on resin (20a) or adhesive agent (20c). Accordingly, in wiring board 1000 of the present embodiment, steps seldom occur at the boundaries between first rigid wiring board 10 and second rigid wiring board 20, and wiring layers (300a, 300b) are formed on entirely flat surfaces. As a result, stresses exerted on wiring layers (300a, 300b) will be mitigated.

As shown in FIG. 1, wiring board 1000 has insulation layers (301, 302), wiring layers (311, 312) (upper-layer wiring layers), via conductors (321, 322) and solder-resist layers (331, 332) in addition to first rigid wiring board 10 and second rigid wiring board 20 described above. Insulation layer 302 corresponds to the first interlayer insulation layer formed on wiring layer (300b) which includes connection portion (P1).

Insulation layer 301 corresponds to the second interlayer insulation layer formed on wiring layer (300a) which includes connection portion (P2). Via conductors (321, 322) are filled vias. Wiring board 1000 has the following structure: On the first-surface side of substrate 200, via conductors (221, 321) are laminated in a direction Z; and on the second-surface side of substrate 200, via conductors (222, 322) are laminated in a direction Z.

The number of via conductors in an interlayer insulation layer directly on second rigid wiring board 20 is preferred to be greater than the number of via conductors in an interlayer insulation layer directly on first rigid wiring board 10. "Directly on" indicates a direction Z (a direction along a normal line to a main surface of the wiring board).

The thickness of wiring layers in second rigid wiring board 20 in the present embodiment is the same as the thickness of wiring layers in first rigid wiring board 10, for example. The thickness of at least one wiring layer in second rigid wiring board 20 is preferred to be set the same as or less than the thickness of a wiring layer in first rigid wiring board 10.

On the first surface of first rigid wiring board 10 and of second rigid wiring board 20, insulation layer 301 (interlayer insulation layer) is formed, and on the second surface of first rigid wiring board 10 and of second rigid wiring board 20, insulation layer 302 (interlayer insulation layer) is formed. Resin (100c) spilled out from insulation layers (301, 302) is filled in through hole (100a).

Wiring layer 311 (upper-layer wiring layer) is formed on insulation layer 301, and wiring layer 312 (upper-layer wiring layer) is formed on insulation layer 302. Via hole (301a) is formed in insulation layer 301, and via hole (302a) is formed in insulation layer 302. In via holes (301a, 302a), a conductor (such as copper) is filled through plating, for example, to form via conductors (321, 322) respectively. Wiring layer (300a) and wiring layer 311 are electrically connected to each other by means of via conductor (321), and wiring layer (300b) and wiring layer 312 are electrically connected to each other by means of via conductor (322).

Solder-resist layer 331 is formed on the first surface of insulation layer 301, and solder-resist layer 332 is formed on the second surface of insulation layer 302. Solder-resist layers (331, 332) are each made of a resin such as photosensitive resins using acrylic-epoxy resins, thermosetting resins mainly containing epoxy resin, or UV-curable resins.

Opening (331a) is formed in solder-resist layer 331, and opening (332a) is formed in solder-resist layer 332. External connection terminal (331b) is formed in opening (331a), and external connection terminal (332b) is formed in opening (332a). External connection terminal (331b) is formed on wiring layer 311, and external connection terminal (332b) is formed on wiring layer 312. External connection terminals (331b, 332b) are solder bumps, for example. External connection terminals (331b, 332b) are used for electrical connection with other wiring boards and electronic components, for example. Wiring board 1000 may be used as a circuit board for a cell phone or the like by being mounted on other wiring boards using one or both of its surfaces, for example.

In wiring board 1000 of the present embodiment, second rigid wiring board 20 is built into accommodation space (R11) of first rigid wiring board 10. First rigid wiring board 10 and second rigid wiring board 20 are electrically connected to each other in inner layers (connection portions (P1, P2)) of wiring board 1000. Namely, in wiring board 1000, first rigid wiring board 10 and second rigid wiring board 20 are formed to be integrated in inner layers of wiring board 1000. Thus, the connection reliability between first rigid wiring board 10 and second rigid wiring board 20 is high against external impact or the like. As a result, cracks may be suppressed from occurring.

Since first rigid wiring board 10 and second rigid wiring board 20 are electrically connected to each other, general manufacturing steps such as forming inner-layer patterns in wiring board 1000 may be used for electrically connecting first rigid wiring board 10 and second rigid wiring board 20. By sharing the manufacturing process, manufacturing costs and manufacturing time may be reduced. Also, separate methods (such as solder and adhesive agents) are not required for connecting first rigid wiring board 10 and second rigid wiring board 20.

Since first rigid wiring board 10 and second rigid wiring board 20 are electrically connected to each other in inner layers of wiring board 1000, the surfaces of wiring board 1000 become flat and seamless. As a result, component-mounting areas or wiring areas will be enlarged on the surfaces of wiring board 1000. In addition, since wiring distances are short compared with cases in which first rigid wiring board 10 and second rigid wiring board 20 are connected at their outermost layers, impedance may be reduced. Also, conductive material required for wiring may be less. Furthermore, impact from signal noise may be reduced.

In wiring board 1000 of the present embodiment, the above effects (improvement in tolerance to impact and flatness features) may be achieved on both surfaces of wiring board 1000 due to connection portion (P1) on the first-surface side and connection portion (P2) on the second surface-side.

In addition, wiring layers and insulation layers are built up on both surfaces of first rigid wiring board 10 and second rigid wiring board 20. Accordingly, the symmetrical features (especially the symmetrical features in directions Z) of wiring board 1000 are enhanced and warping is suppressed in wiring board 1000.

Having built-in first rigid wiring board 10 with lower conductor density and second rigid wiring board 20 with higher conductor density, wiring board 1000 of the present embodiment partially has regions of higher conductor density. In doing so, parts of wiring board 1000 may be easily made fine-pitched.

In wiring board 1000 of the present embodiment, first rigid wiring board 10 and second rigid wiring board 20 are connected by means of resin (20a) spilled out from insulation layers (301, 302). Accordingly, adhesiveness is enhanced between first rigid wiring board 10 and second rigid wiring board 20. In addition, since resin (20a) becomes a buffer, when impact is exerted from outside, such impact will not be conveyed directly to second rigid wiring board 20. Accordingly, tolerance to impact will increase in second rigid wiring board 20.

Via conductors (221, 321) laminated in a direction Z will allow second rigid wiring board 20 to receive impact from the first-surface side. In addition, via conductors (222, 322) laminated in a direction Z will allow second rigid wiring board 20 to receive impact from the second-surface side. Accordingly, tolerance to impact will increase in second rigid wiring board 20.

Figure 6:
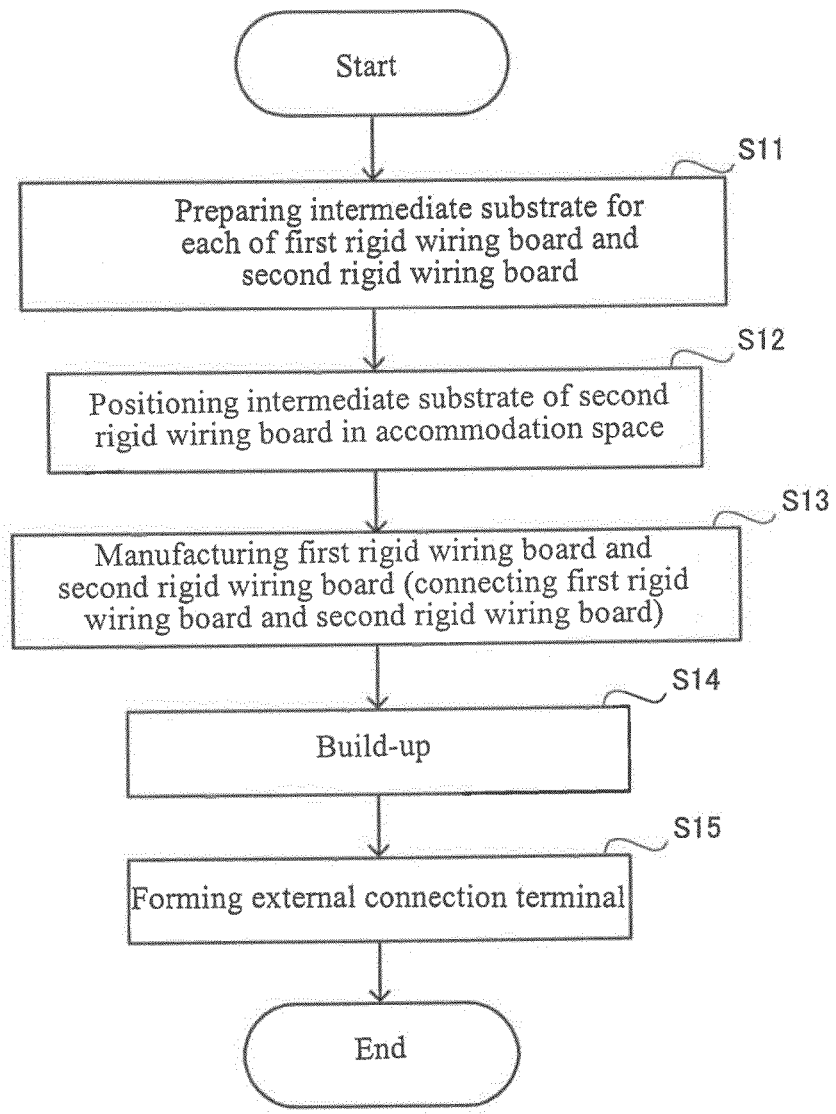
FIG. 6 is a flowchart showing the procedure of a method for manufacturing a wiring board relating to the first embodiment of the present invention.

Wiring board 1000 is manufactured through a procedure shown in FIG. 6, for example.

"Preparing" includes situations in which material and components are purchased to manufacture as well as situations in which finished products are purchased to use them accordingly.

In step (S11), an intermediate substrate is prepared for each of first rigid wiring board 10 and second rigid wiring board 20.

The intermediate substrate for first rigid wiring board 10 is substrate 1013 (first intermediate substrate) manufactured through the steps shown in FIGS. (7, 8), for example. Substrate 1013 does not have outermost wiring layers (300a, 300b) (FIG. 3).

Figure 7:
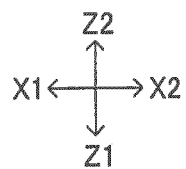
FIG. 7 is a view to illustrate a first step of the procedure for preparing an intermediate substrate (first intermediate substrate) of a first rigid wiring board.
Figure 7:
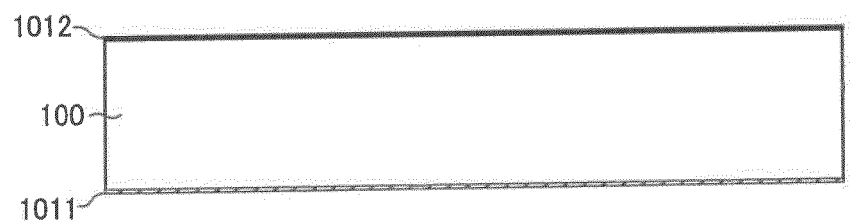

When manufacturing substrate 1013, a double-sided copper-clad laminate having substrate 100 and copper foils (1011, 1012) is prepared as shown in FIG. 7. Copper foil 1011 is formed on the first surface of substrate 100, and copper foil 1012 is formed on the second surface of substrate 100.

Figure 8:
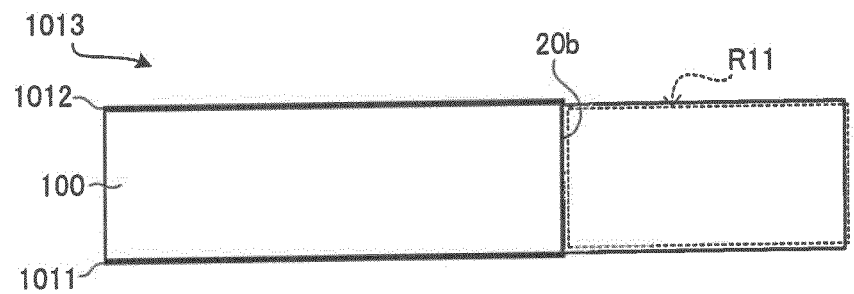
FIG. 8 is a view to illustrate a second step of the procedure for preparing a first intermediate substrate.

As shown in FIG. 8, accommodation space (R11) is created by forming penetrating hole (20b) (FIG. 4) in the above double-sided copper-clad laminate by using a laser, for example. In doing so, substrate 1013 is completed. Here, the size of accommodation space (R11) is preferred to be made substantially the same as, for example, the size of second rigid wiring board 20. For example, accommodation space (R11) is preferred to be made larger than second rigid wiring board 20 by a predetermined margin.

In the meantime, the intermediate substrate of second rigid wiring board 20 is substrate 1023 (second intermediate substrate) manufactured through the steps shown in FIGS. (9, 10), for example. Substrate 1023 does not have outermost wiring layers (300a, 300b) (FIG. 2).

Figure 9:
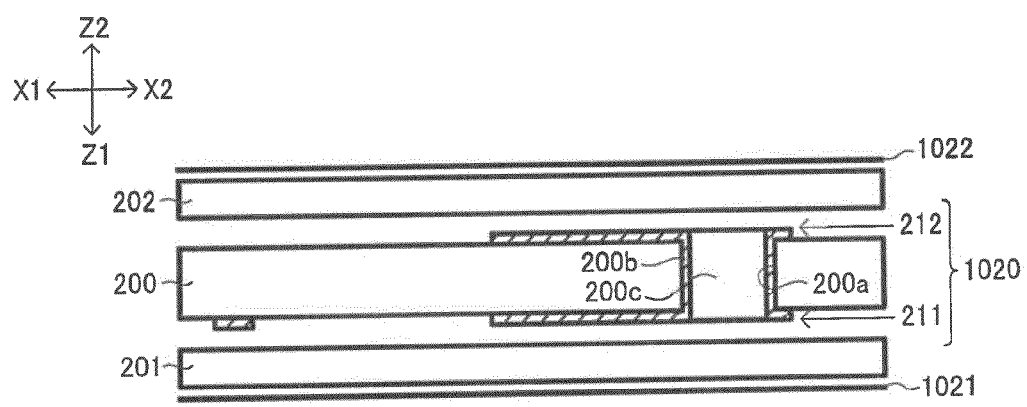
FIG. 9 is a view to illustrate a first step of the procedure for preparing an intermediate substrate (second intermediate substrate) of a second rigid wiring board.

When manufacturing substrate 1023, core substrate 1020 of second rigid wiring board 20 is prepared as shown in FIG. 9. Insulation layer 201 and copper foil 1021 are positioned on the first-surface side of core substrate 1020, and insulation layer 202 and copper foil 1022 are positioned on the second-surface side of core substrate 1020. At this stage, insulation layers (201, 202) (prepreg) are still uncured.

Figure 10:
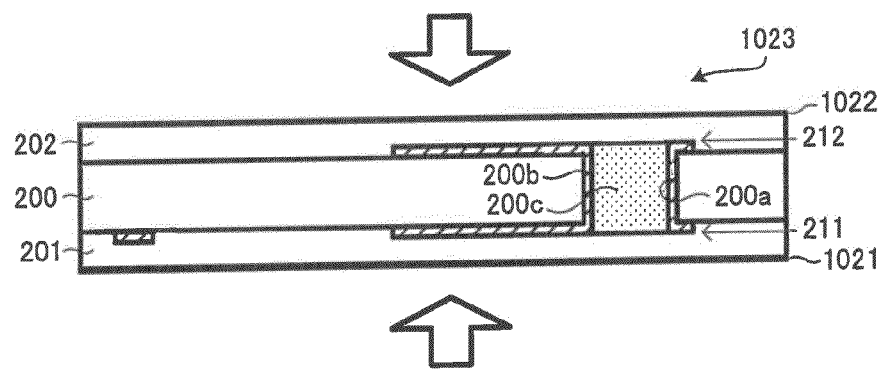
FIG. 10 is a view to illustrate a second step of the procedure for preparing a second intermediate substrate.

As shown in FIG. 10, pressure is exerted onto outermost copper foils (1021, 1022). Such pressing is thermal pressing, for example. During such pressing, it is preferred, for example, that the members (pressing targets) as positioned above be sandwiched by a pressing device aligned by pins, and that pressure be exerted substantially perpendicular to the main surfaces.

In doing so, resin (200c) is spilled out from the prepreg forming each of insulation layers (201, 202). Resin (200c) is filled in through hole (200a). Through pressing and heating, each prepreg is cured and the members are adhered to each other. As a result, substrate 1023 is completed. Pressing and heating treatments may be divided into multiple procedures. Also, heating and pressing treatments may be conducted separately.

Figure 11:
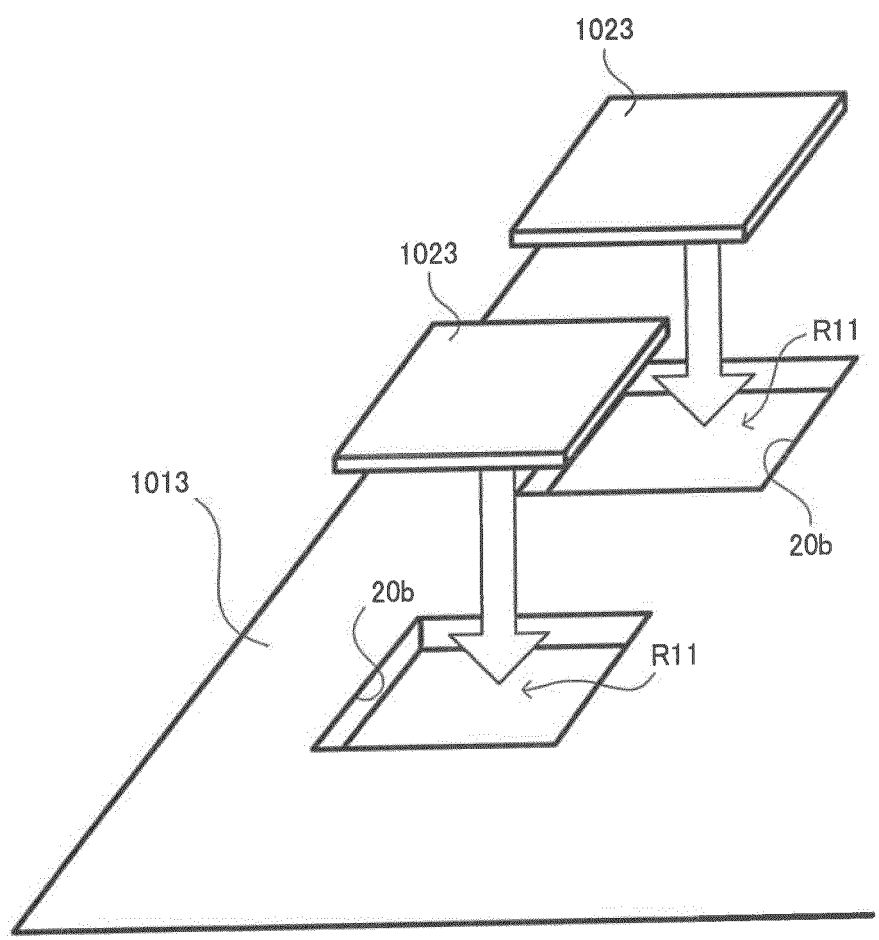
FIG. 11 is a view to illustrate a step for positioning second intermediate substrates in accommodation spaces.

In step (S12) of FIG. 6, substrate 1023 is positioned into penetrating hole (20b) (accommodation space (R11)) of substrate 1013 as shown in FIG. 11. Accordingly, the first surface of first rigid wiring board 10 and the first surface of second rigid wiring board 20, as well as the second surface of first rigid wiring board 10 and the second surface of second rigid wiring board 20, will be set at substantially the same level and their boundaries will become substantially flat. To preliminarily secure substrate 1023, adhesive agent (20c) is filled in the clearance between substrate 1013 and substrate 1023 by using a dispenser, for example (see FIG. 4 or FIG. 5). Adhesive agent (20c) is preferred to be formed to protrude from the surface of substrate 1013 and the surface of substrate 1023, and then to be flattened by buff polishing or the like.

In step (S13) of FIG. 6, first rigid wiring board 10 and second rigid wiring board 20 are electrically connected. Accordingly, first rigid wiring board 10 (FIG. 3) and second rigid wiring board 20 (FIG. 2) are manufactured.

Figure 12:
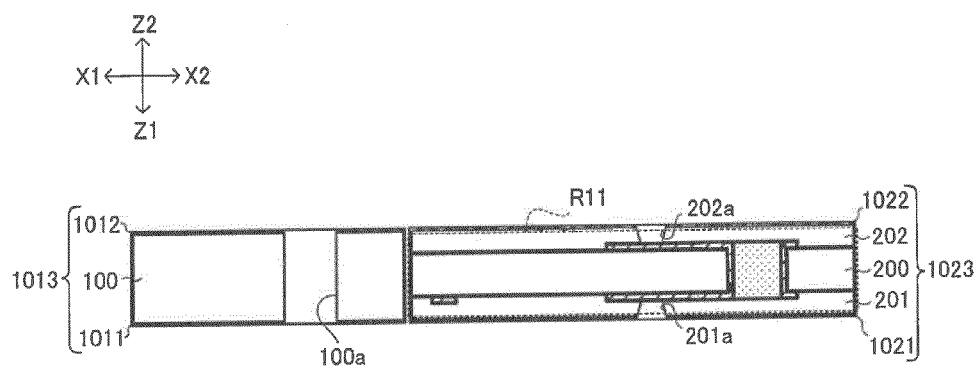
FIG. 12 is regarding a first intermediate substrate and a second intermediate substrate, a view to illustrate a step for forming via holes and through holes.

More specifically, substrate 1023 is positioned in accommodation space (R11) by the treatment in above step (S12). From such a state, by irradiating a $CO_2$ laser, for example, via holes (201a, 202a) and through hole (100a) are formed as shown in FIG. 12. Desmearing and soft etching are conducted if required.

Figure 13:
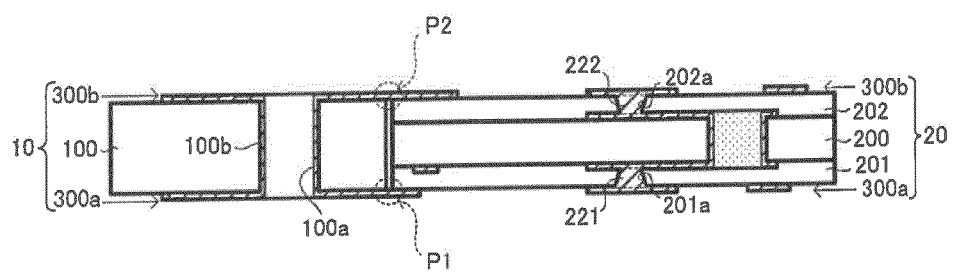
FIG. 13 is regarding outermost layers of a first rigid wiring board and a second rigid wiring board, a view to illustrate a plating step and a patterning step.

As shown in FIG. 13, plated film is formed on the entire first surface and second surface by panel plating (such as chemical copper plating or copper electroplating). Such plated film is patterned by a predetermined lithographic procedure (for example, preliminary treatment, lamination, exposure to light, development, etching, film removal and so forth). Roughened surfaces are formed if required.

Accordingly, first rigid wiring board 10 and second rigid wiring board 20 electrically connected to each other are manufactured. Namely, through such plating, via conductor 221 is formed in via hole (201a), via conductor 222 is formed in via hole (202a), and through-hole conductor (100b) is formed in through hole (100a). Also, wiring layer (300a) is formed on the first surface of substrate 100 and of insulation layer 201, and wiring layer (300b) is formed on the second surface of substrate 100 and of insulation layer 202. First rigid wiring board 10 and second rigid wiring board 20 are connected to each other by means of shared wiring layers (300a, 300b) at connection portion (P1) on the first-surface side and connection portion (P2) on the second-surface side.

In step (S14) of FIG. 6, wiring layers and insulation layers are built up on both surfaces of first rigid wiring board 10 and second rigid wiring board 20.

Figure 14:
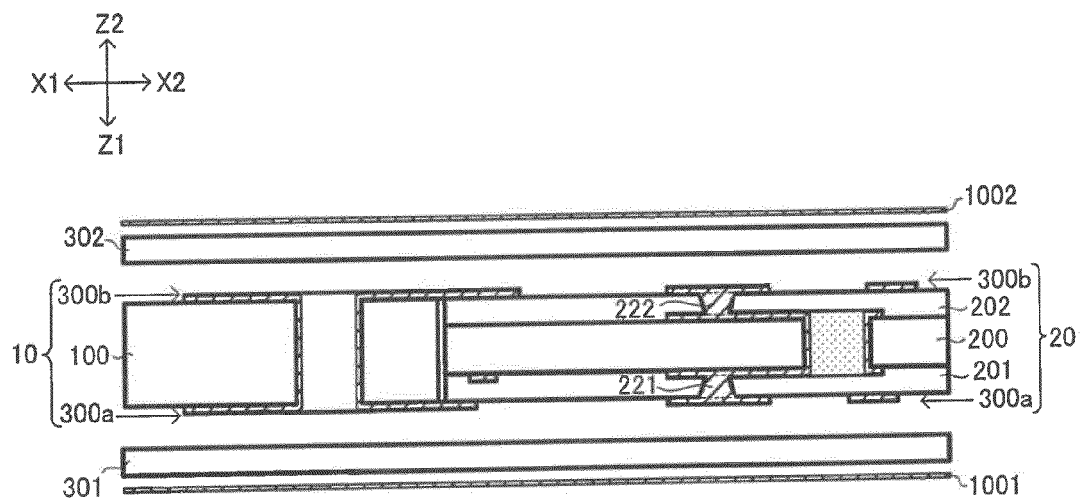
FIG. 14 is a view to illustrate a step for positioning insulation layers and copper foils when forming upper layers.

More specifically, as shown in FIG. 14, insulation layer 301 and copper foil 1001 are positioned on the first-surface side of first rigid wiring board 10 and of second rigid wiring board 20, and insulation layer 302 and copper foil 1002 are positioned on the second-surface side of first rigid wiring board 10 and of second rigid wiring board 20. At this stage, insulation layers (301, 302) (prepreg) are still uncured.

Figure 15:
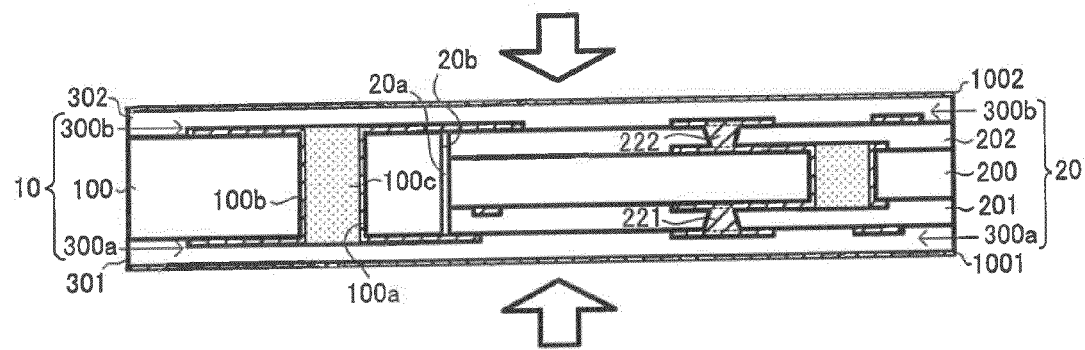
FIG. 15 is a view to illustrate a pressing step when forming upper layers.

As shown in FIG. 15, pressure is exerted onto outermost copper foils (1001, 1002) through the same process as in FIG. 10. Accordingly, openings on both ends of penetrating hole (20b) are blocked by insulation layer 301 on the first-surface side and insulation layer 302 on the second-surface side. Also, resin (20a) and resin (100c) are spilled out from the prepreg forming each of insulation layers (301, 302). Resin (20a) is filled in the clearance between substrate 100 and second rigid wiring board 20, and resin (100c) is filled in through hole (100a). Through pressing and heating, each prepreg is cured, and the members will be adhered to each other.

Figure 16:
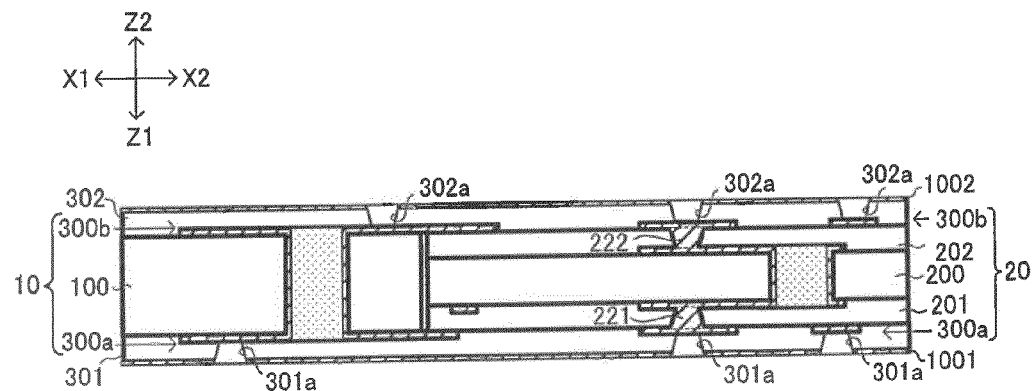
FIG. 16 is regarding upper layers, a view to illustrate a step for forming via holes.

As shown in FIG. 16, by irradiating a $CO_2$ laser, for example, via holes (301a, 302a) are formed. Desmearing and soft etching are conducted if required.

Figure 17:
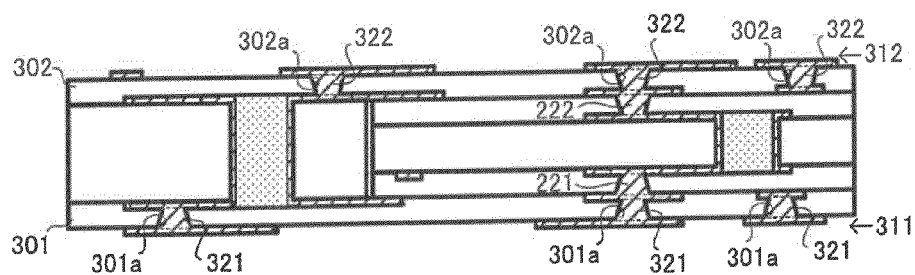
FIG. 17 is a view to illustrate a plating step and a patterning step when forming upper layers.

Plated film is formed on the entire first surface and second surface by panel plating (such as chemical copper plating or copper electroplating) and such plated film is patterned by a predetermined lithographic procedure as shown in FIG. 17. Through such plating, via conductor 321 is formed in via hole (301a) and via conductor 322 is formed in via hole (302a). Also, wiring layer 311 is formed on the first surface of insulation layer 301 and wiring layer 312 is formed on the second surface of insulation layer 302. Roughened surfaces are formed if required.

In step (S15) of FIG. 6, external connection terminals are formed on the outermost layers.

Figure 18:
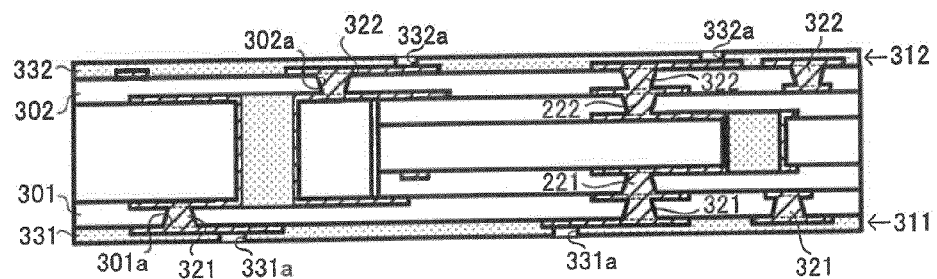
FIG. 18 is a view to illustrate a step for forming solder-resist layers.

More specifically, as shown in FIG. 18, solder-resist layer 331 is formed on the first surface of insulation layer 301 and solder-resist layer 332 is formed on the second surface of insulation layer 302 through application or lamination, for example. Through a predetermined lithographic procedure, openings (331a, 332a) are formed in solder-resist layers (331, 332). Through openings (331a, 332a), parts of wiring layers (311, 312) are exposed as pads. Surface treatments, such as Ni/Au plating or OSP (Organic Solderability Preservative), are conducted on such pads, if required. In the present embodiment, openings (331a, 332a) are formed after forming solder-resist layers (331, 332), but the present embodiment is not limited to such. For example, solder-resist layers (331, 332) may be selectively formed by positioning in advance a mask material in areas for openings (331a, 332a) so that solder-resist layers (331, 332) may be formed to have openings (331a, 332a) from the initial stage.

By printing solder paste and reflowing, external connection terminals (331b, 332b) (solder bumps) are formed in openings (331a, 332a). External connection terminals (331b, 332b) are positioned on pads. Accordingly, wiring board 1000 (FIG. 1) is completed. Also, external processing, warping correction, conductivity inspection, exterior inspection or final inspection is conducted according to requirements.

The manufacturing method according to the present embodiment is suitable for manufacturing wiring board 1000. Using such a manufacturing method, an excellent wiring board 1000 may be obtained at low cost.

Second Embodiment

A wiring board and its manufacturing method according to the second embodiment of the present invention is described by focusing on its differences from the above first embodiment. Here, the same numerical reference is assigned to each element which is the same as that shown in FIG. 1 and others above, and the descriptions for the shared portions already described above, namely, for the portions whose description would be redundant, are omitted for convenience sake.

Figure 19:
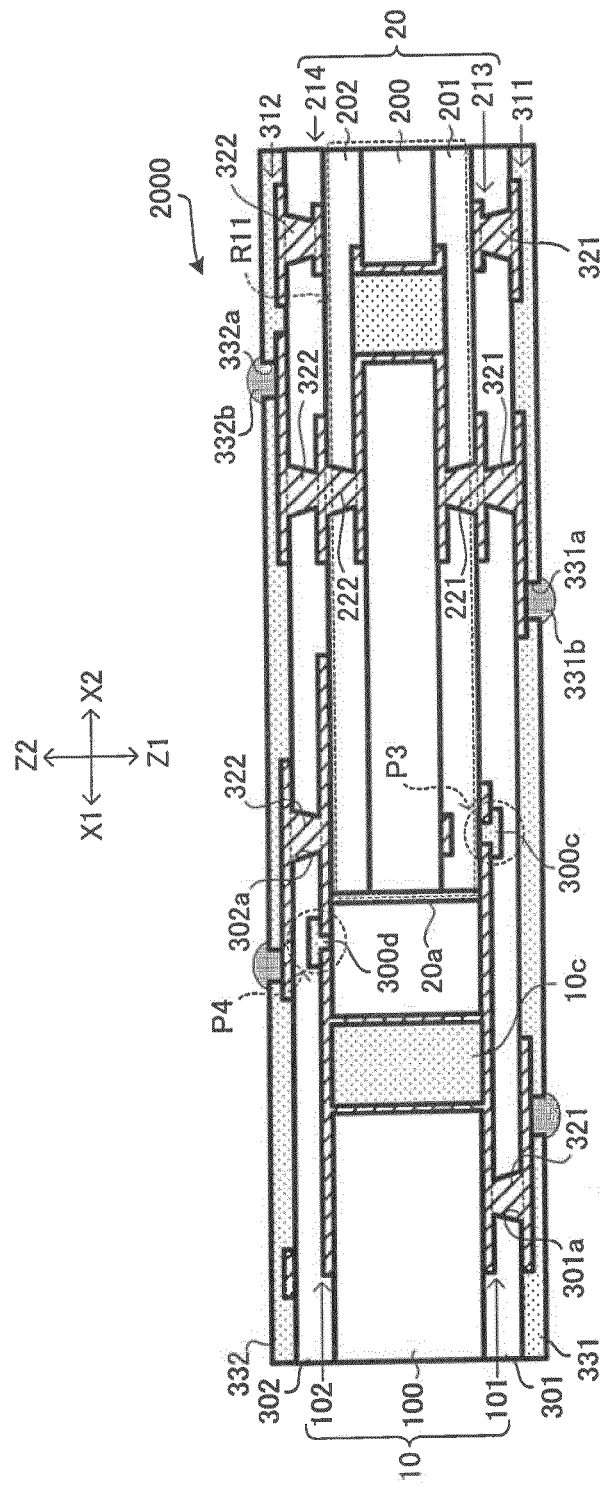
FIG. 19 is a cross-sectional view showing a schematic structure of a wiring board relating to the second embodiment of the present invention.

As shown in FIG. 19, in wiring board 2000 of the present embodiment, first rigid wiring board 10 and second rigid wiring board 20 are electrically connected in inner layers (connection portions (P3, P4)) of wiring board 2000. More specifically, wiring layers (101, 102) are formed on the main surfaces (first surface, second surface) of first rigid wiring board 10, and wiring layers (213, 214) are formed on the main surfaces (first surface, second surface) of second rigid wiring board 20. Connection portion (P3) (second connection portion) is made of conductive paste (300c), and connection portion (P4) (first connection portion) is made of conductive paste (300d). Namely, at connection portion (P3), wiring layer 101 and wiring layer 213 are electrically connected by means of conductive paste (300c). Also, at connection portion (P4), wiring layer 102 and wiring layer 214 are electrically connected by means of conductive paste (300d). As a result, wiring layer 101, wiring layer 213 and conductive paste (300c), as well as wiring layer 102, wiring layer 214 and conductive paste (300d), are formed to be discontinuous.

Conductive pastes (300c, 300d) are those in which fine conductive particles are mixed into a viscous binder at a predetermined concentration. A binder indicates resins which can bond particles. Conductive pastes (300c, 300d) are distinguished from conductors (plated film) formed by plating.

Steps seldom occur in the boundaries between first rigid wiring board 10 and second rigid wiring board 20. Thus, their first surfaces and second surfaces are set at substantially the same level, and their boundaries are made substantially flat. Also, parts of wiring layers (101, 214) are positioned on resin (20a). As a result, wiring layers (101, 213) and wiring layers (102, 214) are each formed on flat surfaces.

Figure 20:
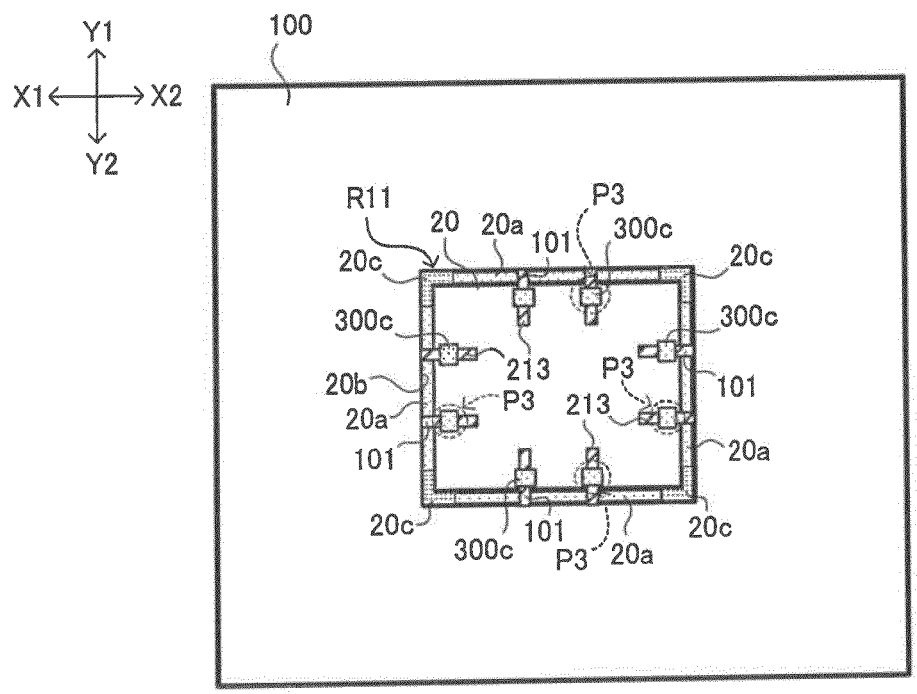
FIG. 20 is a view showing how a wiring layer of a first rigid wiring board and a wiring layer of a second rigid wiring board are connected on a first surface.
Figure 21:
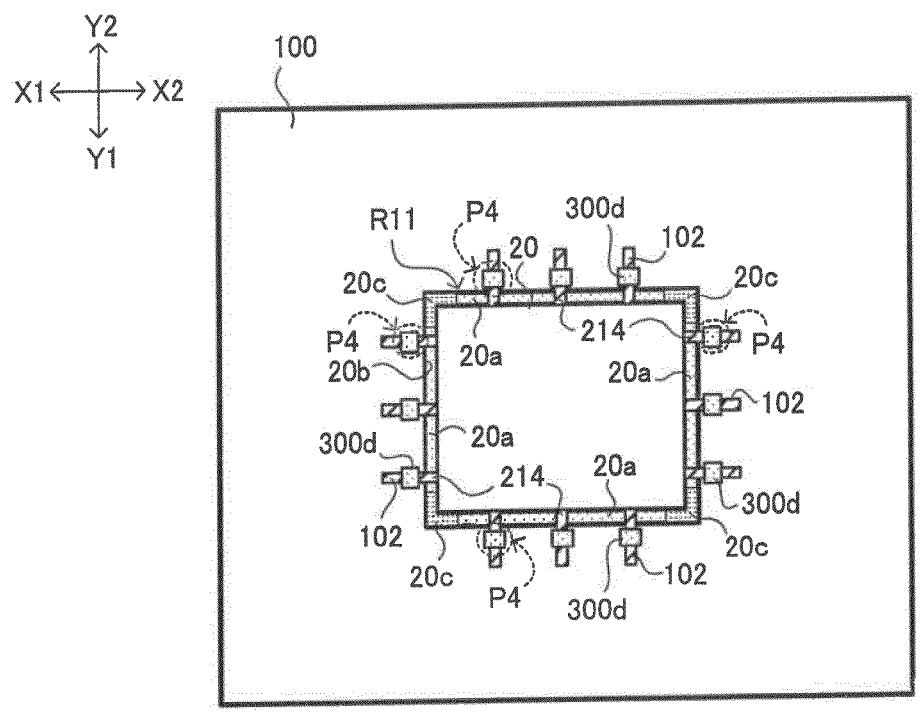
FIG. 21 is a view showing how a wiring layer of a first rigid wiring board and a wiring layer of a second rigid wiring board are connected on a second surface.

As shown in FIG. 20, on the first-surface side, wiring layer 101 extends along the main surface from a boundary (an end portion of first rigid wiring board 10) between substrate 100 and second rigid wiring board 20 toward second rigid wiring board 20, and is connected to wiring layer 213 on second rigid wiring board 20 (insulation layer 201). Wiring layer 101 and wiring layer 213 are connected at each side (four sides) of second rigid wiring board 20, for example. Also, as shown in FIG. 21, on the second-surface side, wiring layer 214 extends along the main surface from a boundary (an end portion of second rigid wiring board 20) between substrate 100 and second rigid wiring board 20 toward substrate 100, and is connected to wiring layer 102 on first rigid wiring board 10 (substrate 100). Wiring layer 102 and wiring layer 214 are connected at each side (four sides) of second rigid wiring board 20, for example. The number of connected portions and their connected positions are not limited specifically.

Figure 22:
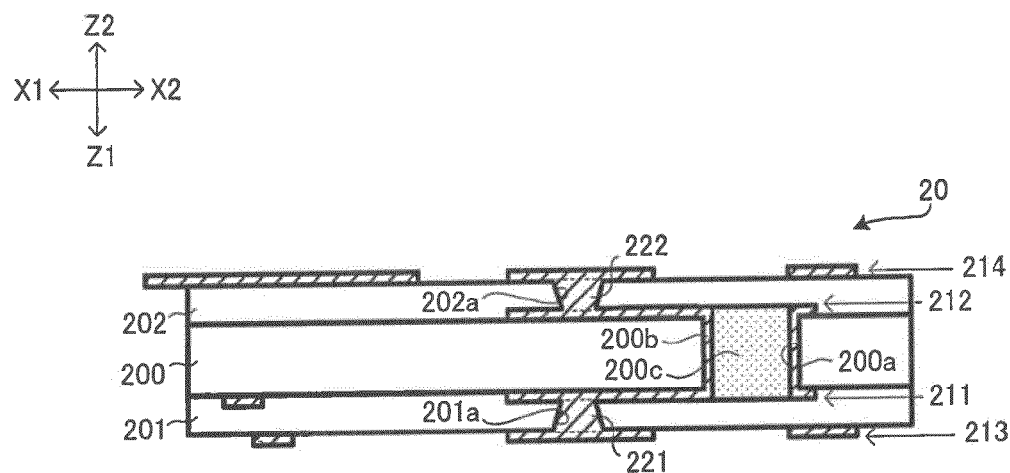
FIG. 22 is a cross-sectional view showing a schematic structure of a second rigid wiring board.

As shown in FIG. 22, second rigid wiring board 20 has wiring layer 213 (fourth wiring layer) on the first surface (fourth main surface), and wiring layer 214 (second wiring layer) on the second surface (second main surface). Wiring layer 214 extends along the second surface (in a direction X) from an end portion (side surface) of second rigid wiring board 20.

Figure 23:
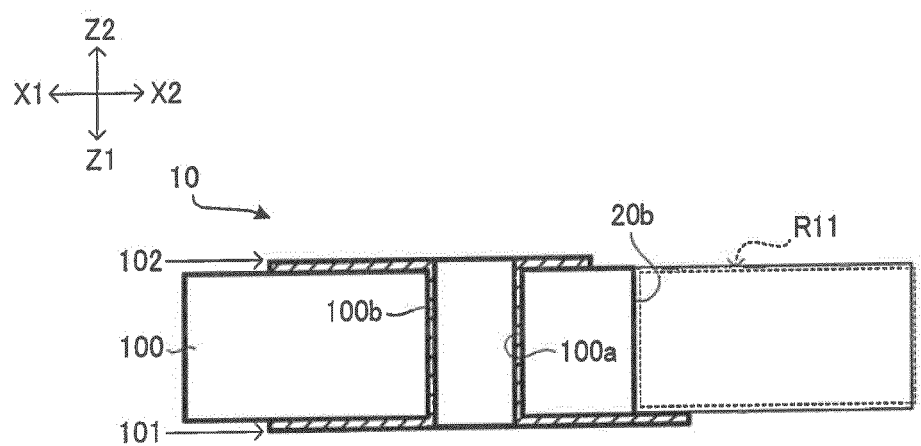
FIG. 23 is a cross-sectional view showing a schematic structure of a first rigid wiring board.

As shown in FIG. 23, first rigid wiring board 10 has wiring layer 101 (third wiring layer) on the first surface (third main surface), and wiring layer 102 (first wiring layer) on the second surface (first main surface). Wiring layer 101 extends along the first surface (in a direction X) from an end portion (wall surface of penetrating hole (20b)) of first rigid wiring board 10.

Figure 24:
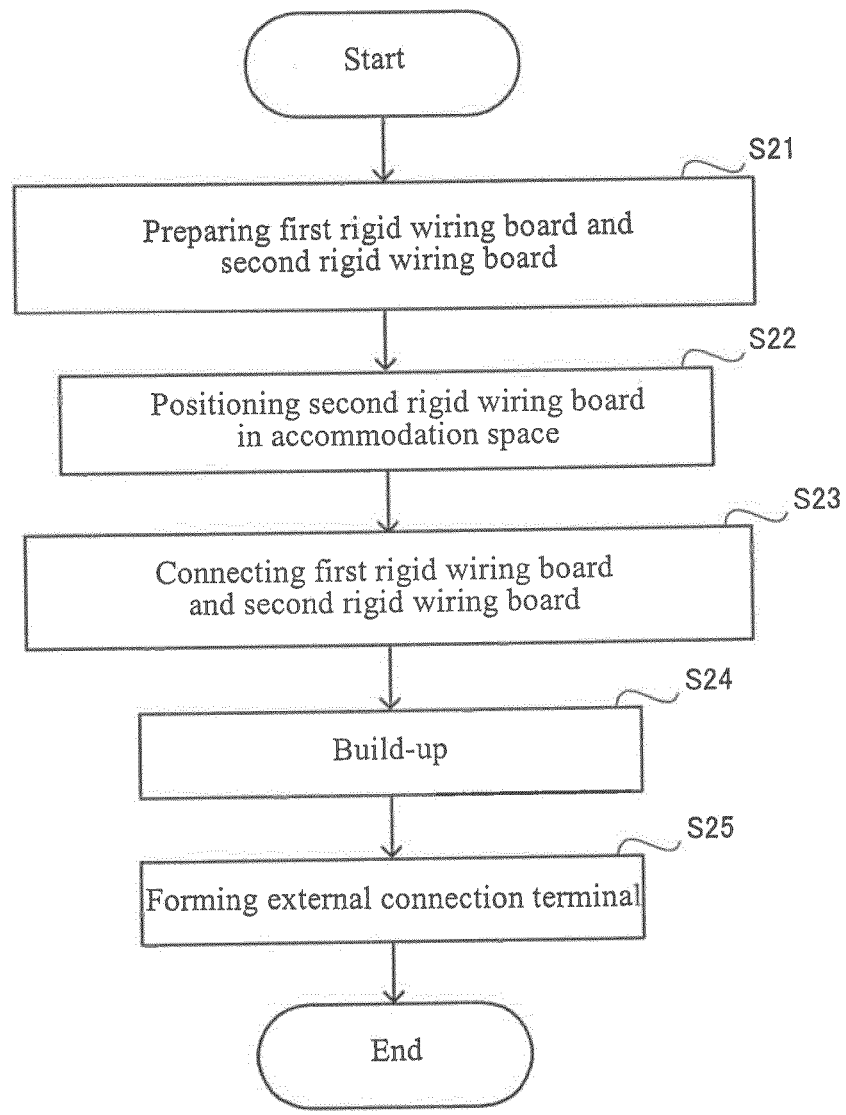
FIG. 24 is a flowchart showing the procedure of a method for manufacturing a wiring board relating to the second embodiment of the present invention.

Wiring board 2000 is manufactured through a procedure shown in FIG. 24, for example.

Figure 25:
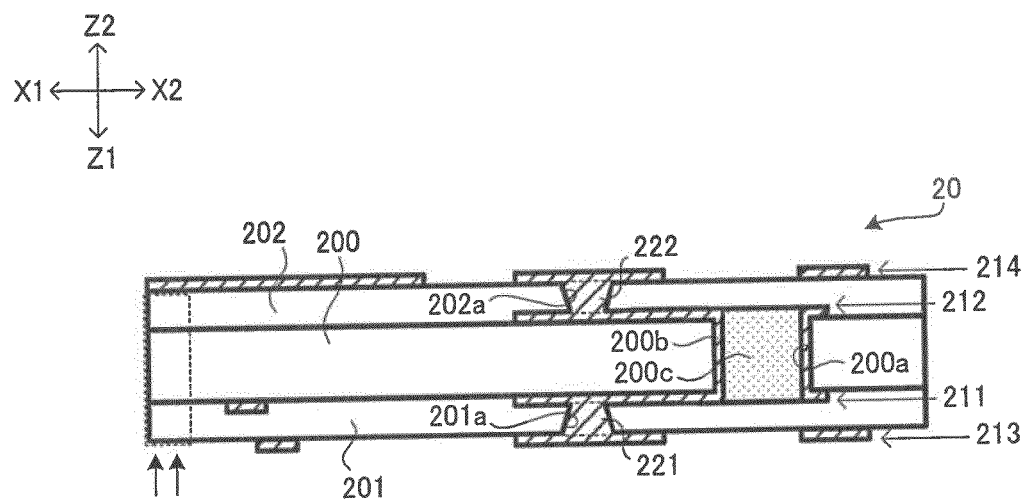
FIG. 25 is a view to illustrate a step for preparing a first rigid wiring board.
Figure 26:
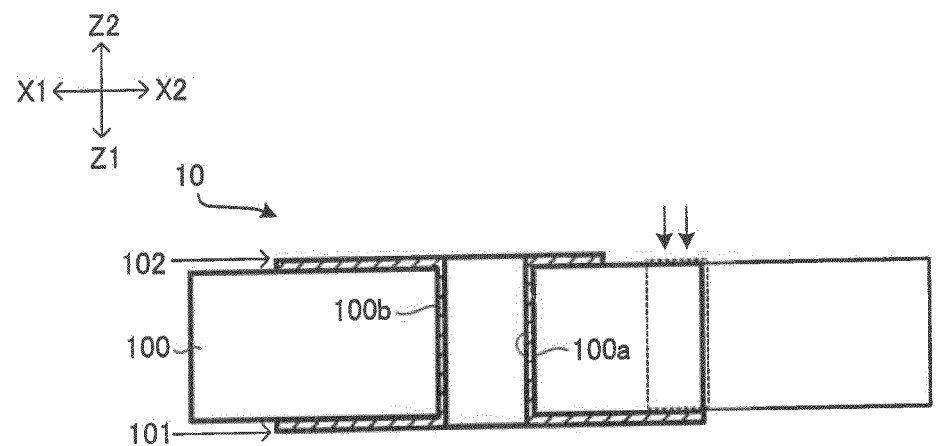
FIG. 26 is a view to illustrate a step for preparing a second rigid wiring board.

In step (S21), first rigid wiring board 10 and second rigid wiring board 20 are prepared. First rigid wiring board 10 and second rigid wiring board 20 may be manufactured by a well-known build-up method, for example. As shown in FIG. 25, for example, an extended portion of wiring layer 214 in second rigid wiring board 20 may be formed by removing substrate 200 and insulation layers (201, 202) on the first-surface side by using a laser or the like after wiring layer 214 is formed. Also, an extended portion of wiring layer 101 in first rigid wiring board 10 may be formed by removing substrate 100 on the second-surface side by using a laser or the like after forming wiring layer 101, for example, as shown in FIG. 26.

Figure 27:
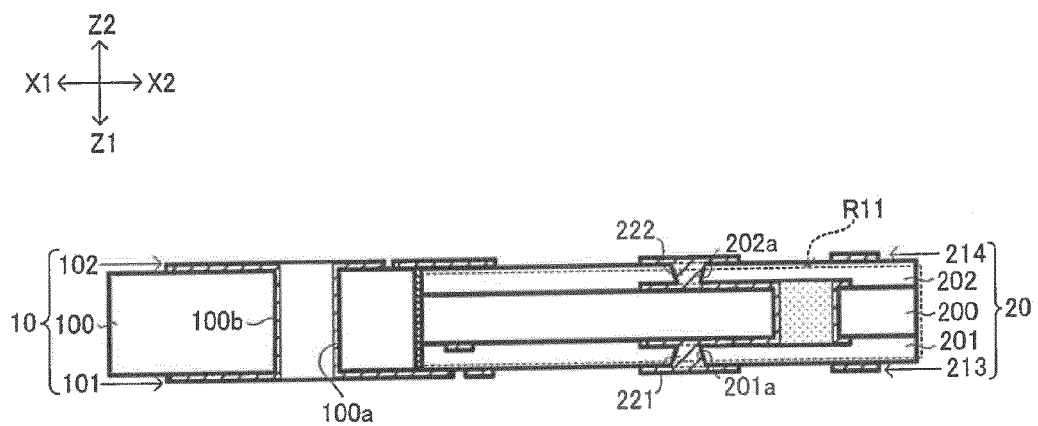
FIG. 27 is a view to illustrate a step for positioning a second rigid wiring board in an accommodation space.

In step (S22) of FIG. 24, second rigid wiring board 20 is positioned in accommodation space (R11) of first rigid wiring board 10 as shown in FIG. 27. Accordingly, the first surface of first rigid wiring board 10 and the first surface of second rigid wiring board 20, as well as the second surface of first rigid wiring board 10 and the second surface of second rigid wiring board 20, are each made substantially flat. The same as in step (S12) of FIG. 6, to preliminarily secure second rigid wiring board 20, adhesive agent (20c) is filed in the clearances at four corners of second rigid wiring board 20 among the clearances between first rigid wiring board 10 (substrate 100) and second rigid wiring board 20 by using a dispenser.

Figure 28:
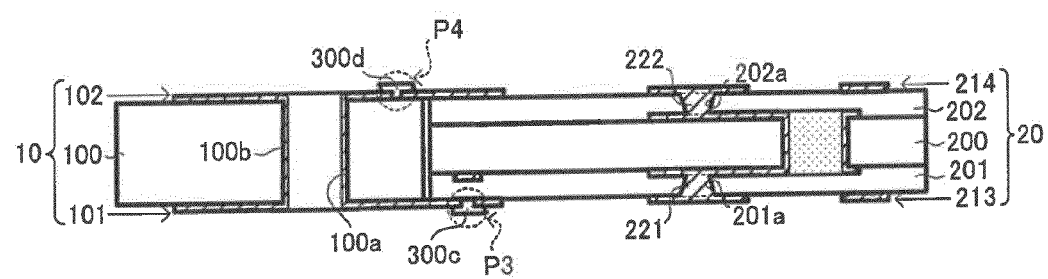
FIG. 28 is a view to illustrate a step for electrically connecting a first rigid wiring board and a second rigid wiring board.

In step (S23) of FIG. 24, first rigid wiring board 10 and second rigid wiring board 20 are electrically connected by applying conductive pastes (300c, 300d) as shown in FIG. 28. According to requirements, conductive pastes (300c, 300d) are cured. Accordingly, wiring layer 101 and wiring layer 213 are electrically connected at connection portion (P3) by means of conductive paste (300c). Also, wiring layer 102 and wiring layer 214 are electrically connected at connection portion (P4) by means of conductive paste (300d).

In step (S24) of FIG. 24, the same as in step (S14) of FIG. 6, wiring layers (311, 312) and insulation layers (301, 302) are built up on both surfaces of first rigid wiring board 10 and second rigid wiring board 20. In step (S25) of FIG. 24, the same as in step (S15) of FIG. 6, external connection terminals (331b, 332b) are formed on the outermost layers. As a result, wiring board 2000 (FIG. 19) is completed.

The manufacturing method of the present embodiment is suitable for manufacturing wiring board 2000. An excellent wiring board 2000 may be obtained at low cost by such a manufacturing method.

Other Embodiments

Figure 29:
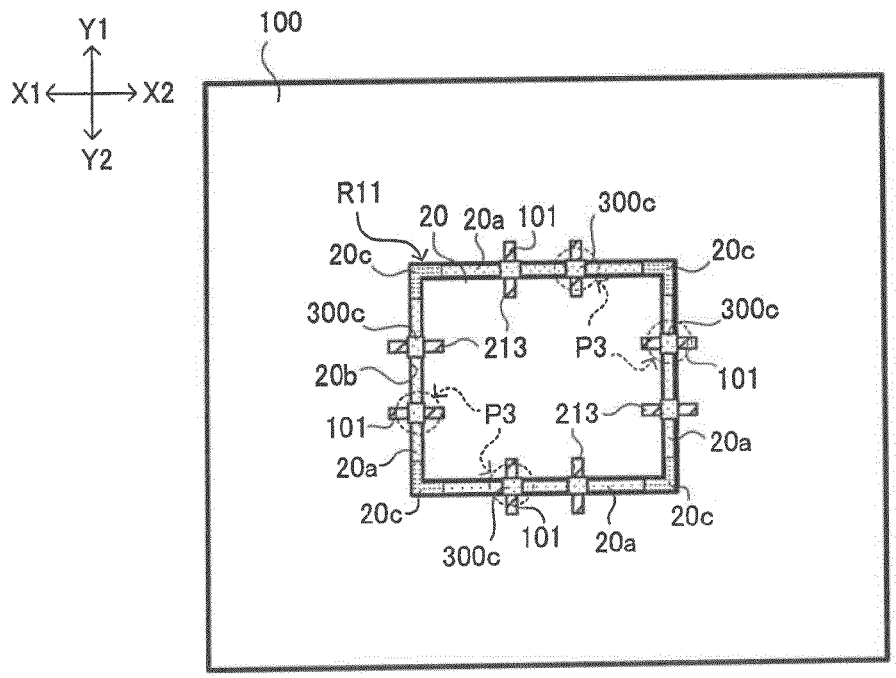
FIG. 29 is a view showing an example in which conductive paste is arranged in boundaries (on resin) between a first rigid wiring board and a second rigid wiring board.
Figure 30:
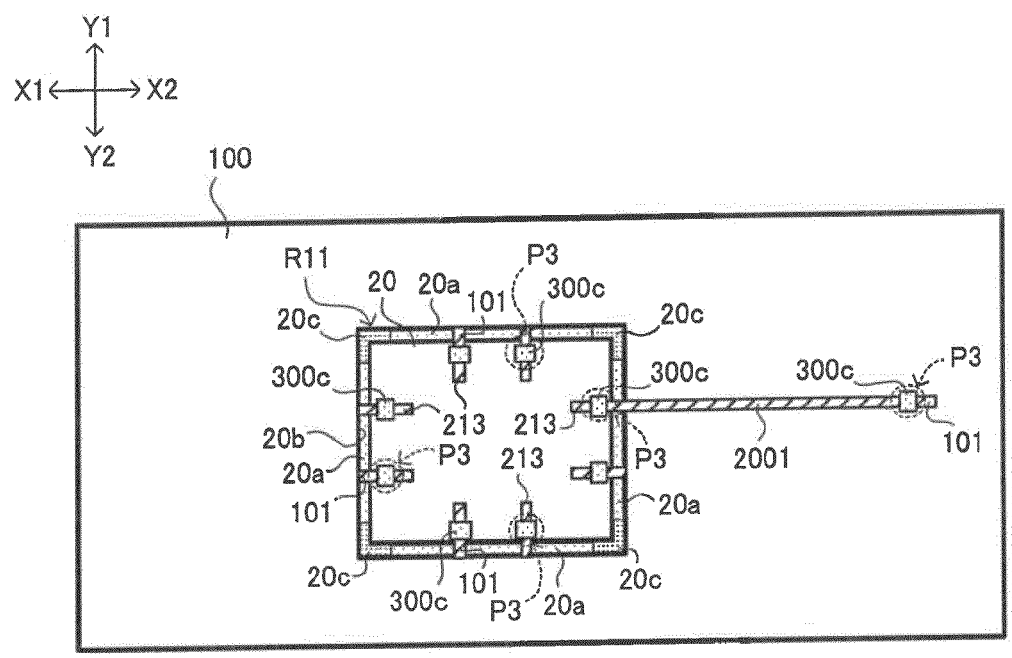
FIG. 30 is a view showing an example in which a first rigid wiring board and a second rigid wiring board are electrically connected by using a junction conductor.

In the second embodiment above, conductive paste (300c) (connection portion (P3)) may be positioned in the boundary (on resin (20a)) between first rigid wiring board 10 and second rigid wiring board 20 as shown in FIG. 29 (a view corresponding to FIG. 20), for example. Moreover, as shown in FIG. 30 (a view corresponding to FIG. 20), junction conductor 2001 made of copper, for example, is used and both ends of junction conductor 2001 may be connected to wiring layers (101, 213) with conductive paste (300c). The same process may be employed for conductive paste (300d) (connection portion (P4)).

Figure 31:
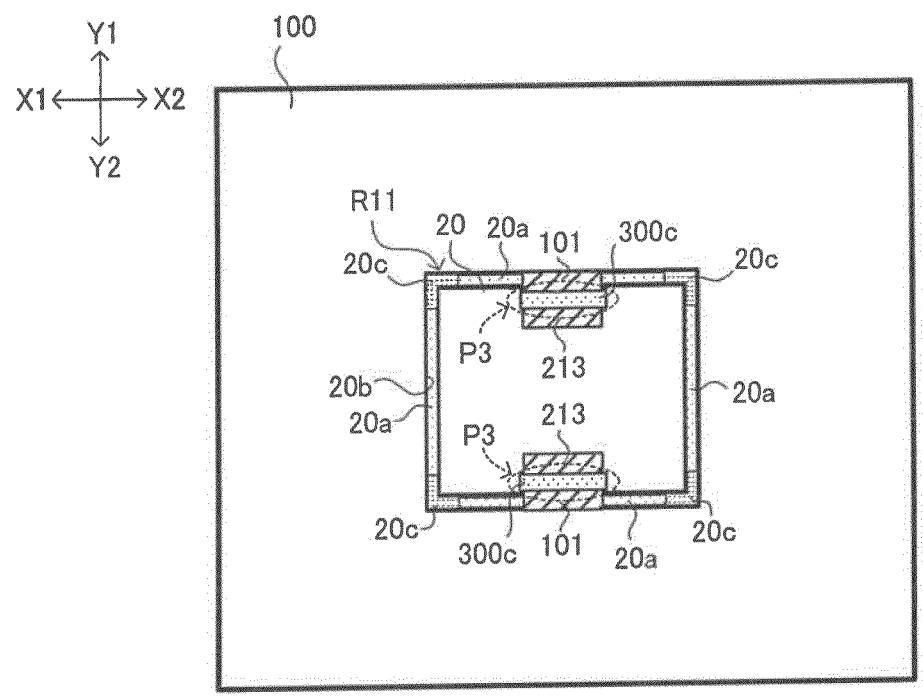
FIG. 31 is a view showing an example in which a wiring layer of a first rigid wiring board and a wiring layer of a second rigid wiring board are connected only at facing sides of the second rigid wiring board.

When connecting the wiring layers on the main surfaces of first rigid wiring board 10 and the wiring layers on the main surfaces of second rigid wiring board 20 in the first and second embodiments above, the number of connection portions and their connected positions are not limited specifically. For example, as shown in FIG. 31 (a view corresponding to FIG. 20), wiring layer 101 and wiring layer 213 may be connected only at facing sides of second rigid wiring board 20.

In the first and second embodiments above, resin (20a) that has spilled out from the upper insulation layers is filled in the clearance between first rigid wiring board 10 (substrate 100) and second rigid wiring board 20. However, the present invention is not limited to such. For example, resin or the like prepared separately from adhesive agent (20c) may be filled in such a clearance before forming upper insulation layers. In such a case, it is effective to use a dispenser or the like when injecting (filling) resin.

In the first and second embodiments above, due to different numbers of wiring layers, the existing density of conductors in second rigid wiring board 20 is set greater than the existing density of conductors in first rigid wiring board 10. However, the present invention is not limited to such. For example, using different numbers of via conductors or different line widths or pitches of conductive patterns, the existing density of conductors in second rigid wiring board 20 may be set greater than the existing density of conductors in first rigid wiring board 10.

In the first and second embodiments above, via conductors (221, 222, 321, 322) may be conformal vias instead of filled vias. However, in order to enhance tolerance to impact, filled vias are preferred.

Figure 32:
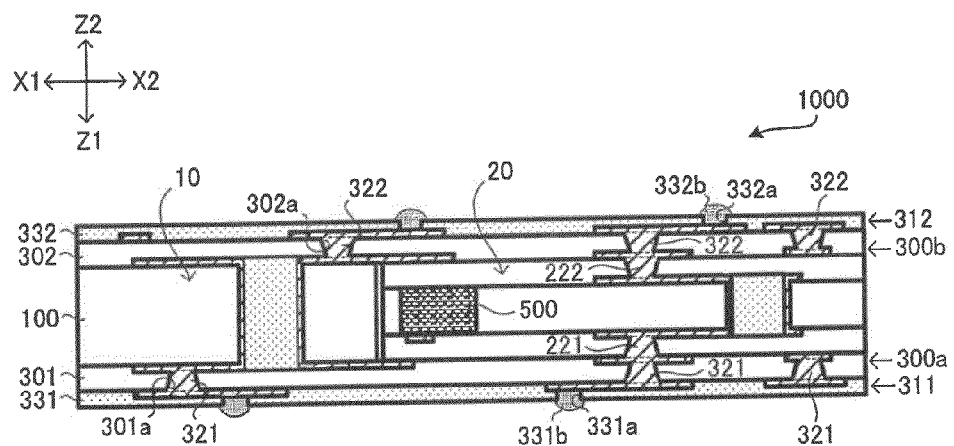
FIG. 32 is a view showing an example of a second rigid wiring board with a built-in electronic component.

In the first and second embodiments above, second rigid wiring board 20 may be such a wiring board with built-in electronic component. For example, as shown in FIG. 32, second rigid wiring board 20 in wiring board 1000 may be such a wiring board with built-in electronic component 500. Also, second rigid wiring board 20 may have multiple built-in electronic components.

Figure 33:
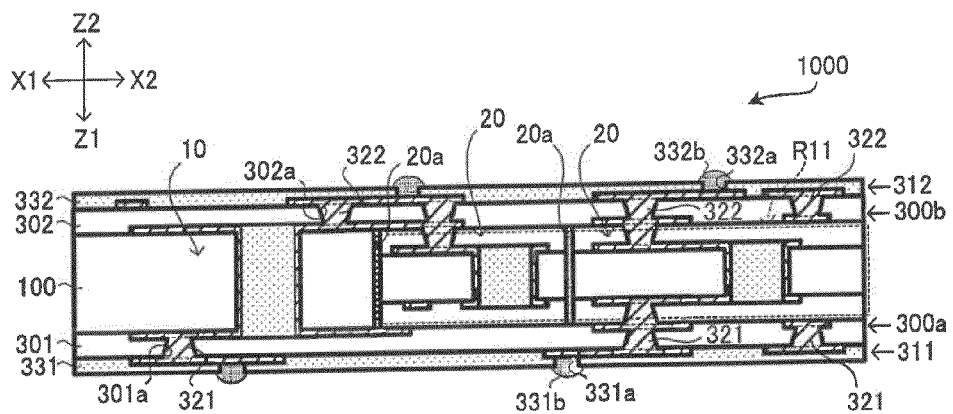
FIG. 33 is a view showing an example of a wiring board with multiple built-in second rigid wiring boards.

In the first and second embodiments above, multiple second rigid wiring boards 20 may be built into single accommodation space (R11) of first rigid wiring board 10. As shown in FIG. 33, multiple second rigid wiring boards 20 may be built into single accommodation space (R11) of first rigid wiring board 10.

Conductive patterns in wiring boards (1000, 2000) may be formed to fan out from component connection terminals (such as external connection terminals (331b)) toward board connection terminals (such as external connection terminals (332b)).

Figure 34:
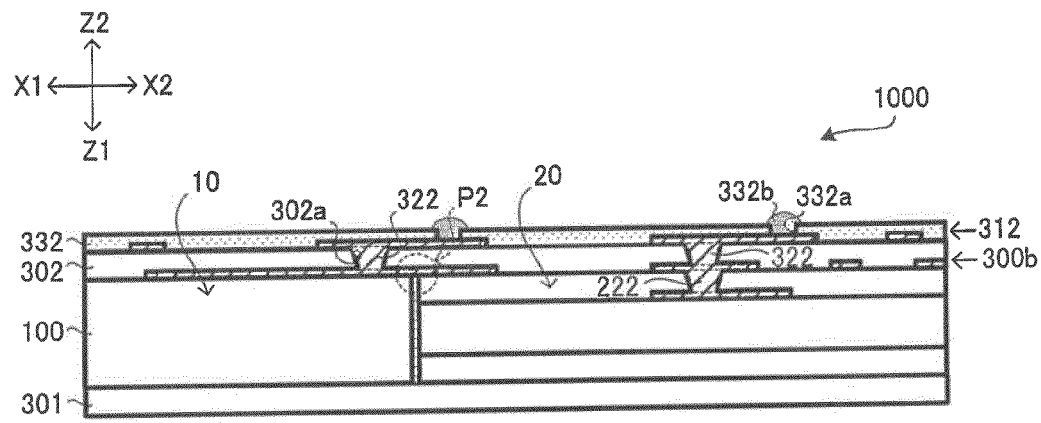
FIG. 34 is a view showing an example in which a first rigid wiring board and a second rigid wiring board respectively have wiring layers only on one side.

In the first and second embodiments above, first rigid wiring board 10 and second rigid wiring board 20 may have wiring layers only on one side. For example, as shown in FIG. 34, first rigid wiring board 10 and second rigid wiring board 20 of wiring board 1000 may have wiring layers only on one side.

In the first and second embodiments above, wiring layers on the main surfaces of first rigid wiring board 10 and wiring layers on the main surfaces of second rigid wiring board 20 may be electrically connected only on either (one surface) of the two main surfaces (first surface, second surface). For example, as shown in FIG. 34, first rigid wiring board 10 and second rigid wiring board 20 may be electrically connected to each other only on the second-surface side by means of wiring layer (300b) of wiring board 1000. In such a case as well, since first rigid wiring board 10 and second rigid wiring board 20 are electrically connected to each other in inner layers of wiring board 1000, the connection reliability between first rigid wiring board 10 and second rigid wiring board 20 is high against external impact or the like.

In the first and second embodiments above, the shape and the size of accommodation space (R11) are not limited specifically. However, the shape and the size corresponding to those of second rigid wiring board 20 are preferred to align second rigid wiring board 20.

Figure 35:
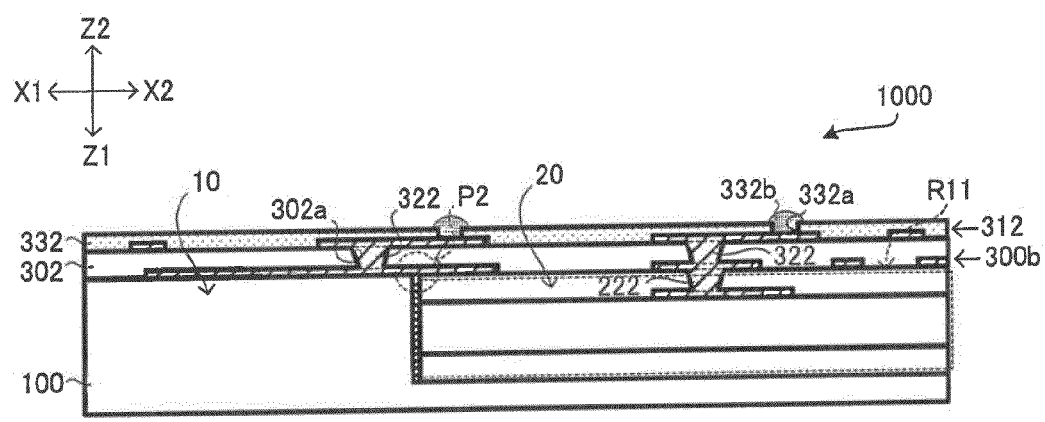
FIG. 35 is a view showing an example in which an accommodation space is a recessed section.

In the first and second embodiments above, accommodation space (R11) is not limited to a through hole. For example, as shown in FIG. 35, accommodation space (R11) of wiring board 1000 may be a recessed section.

Figure 36:
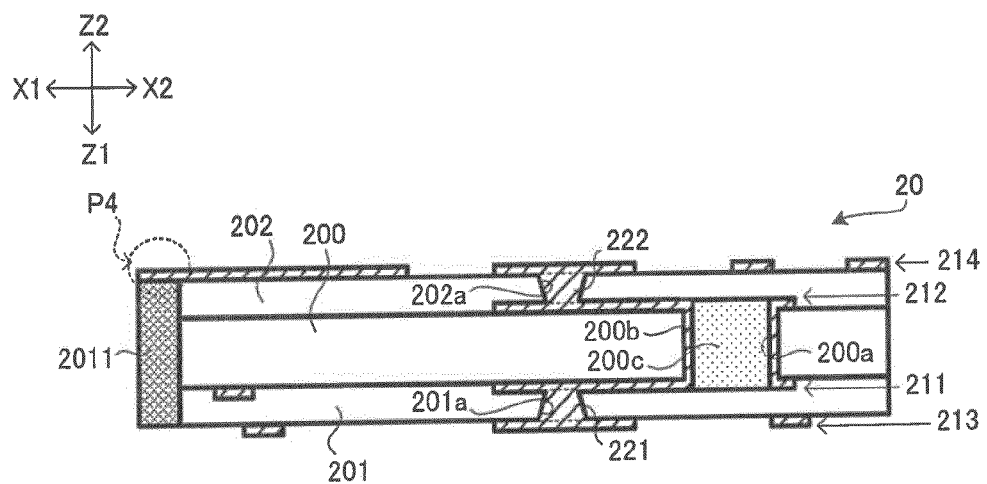
FIG. 36 is a view showing an alternative example of a method for forming an extended portion of a wiring layer in a second rigid wiring board.
Figure 37:
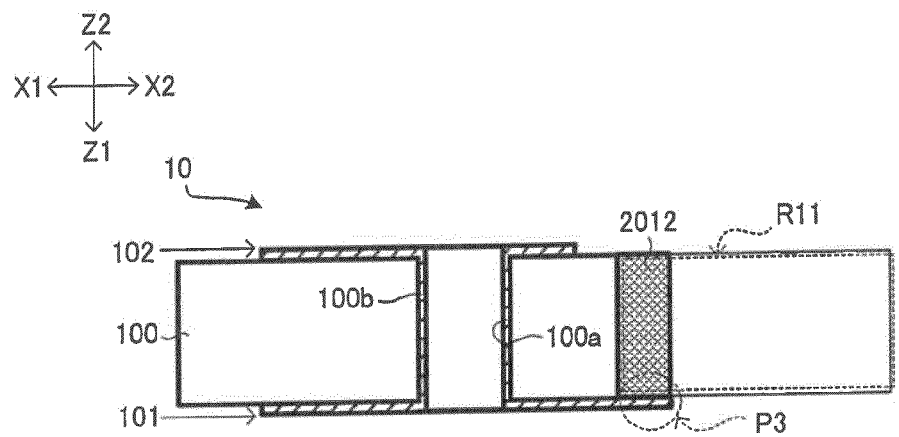
FIG. 37 is a view showing an alternative example of a method for forming an extended portion of a wiring layer in a first rigid wiring board.

In the second embodiment above, an extended portion of wiring layer 214 in second rigid wiring board 20 may also be formed by positioning spacer 2011 underneath in advance as shown in FIG. 36, for example. In addition, an extended portion of wiring layer 101 in first rigid wiring board 10 may also be formed by positioning spacer 2012 underneath in advance as shown in FIG. 37, for example. Spacers (2011, 2012) may be removed after wiring layers (101, 214) are formed.

Regarding other elements in the above embodiments, the position, shape, material, size, pattern or the number of layers of each element may be modified freely within a scope that does not deviate from the gist of the present invention.

The manufacturing method of the present invention is not limited to the contents and order shown in the flowcharts of FIG. 6 and FIG. 24. The contents and order may be modified within a scope that does not deviate from the gist of the present invention. Also, some steps may be omitted according to usage requirements or the like.

For example, wiring board 1000 may be manufactured by a semi-additive method. The manufacturing procedure in such a case is described in the following. Here, the same or equivalent numerical references are used for the elements the same as or equivalent to those in the above embodiments, and their descriptions will be omitted or simplified.

In a manufacturing method using a semi-additive method, via holes (201a, 202a) and through hole (100a) are formed in first rigid wiring board 10 and second rigid wiring board 20, which are adhered to each other by adhesive agent (20c) as described in the first embodiment, for example.

Figure 38:
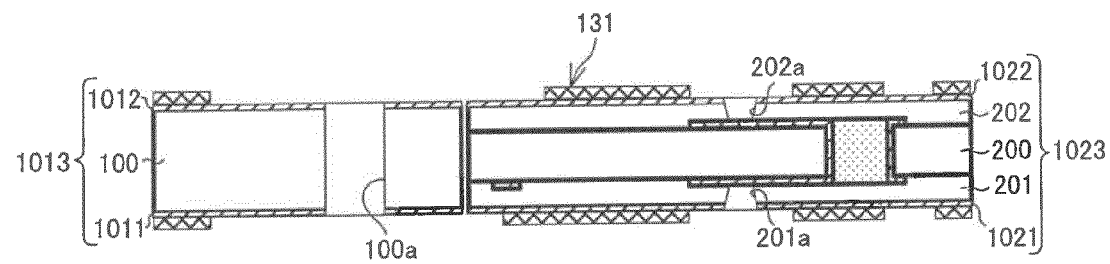
FIG. 38 is a view to illustrate a first step of a manufacturing method using a semi-additive method.

As shown in FIG. 38, patterned plating resist 131 is formed on the surfaces of copper foils (1011, 1012).

Figure 39:
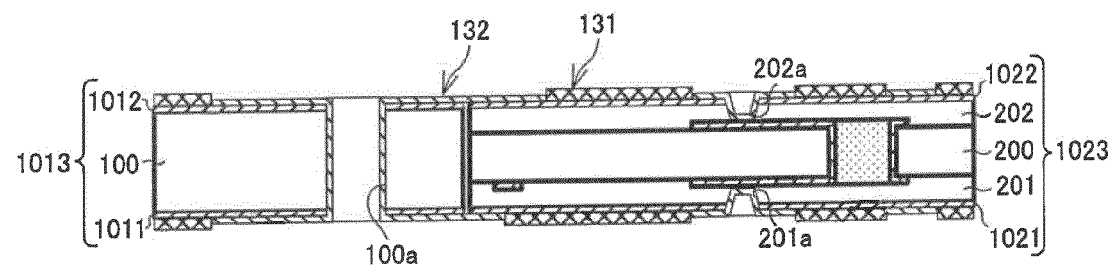
FIG. 39 is a view to illustrate a second step of a manufacturing method using a semi-additive method.

As shown in FIG. 39, plating film 132 is formed through electrolytic copper plating on the surfaces of copper foils (1011, 1012) on which plating resist 131 is formed.

Figure 40:
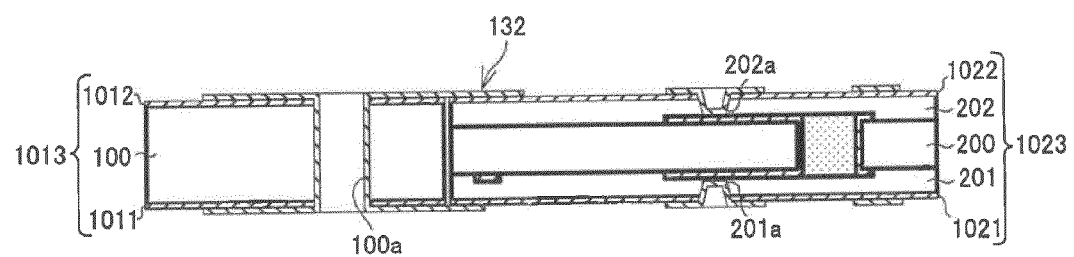
FIG. 40 is a view to illustrate a third step of a manufacturing method using a semi-additive method.
Figure 41:
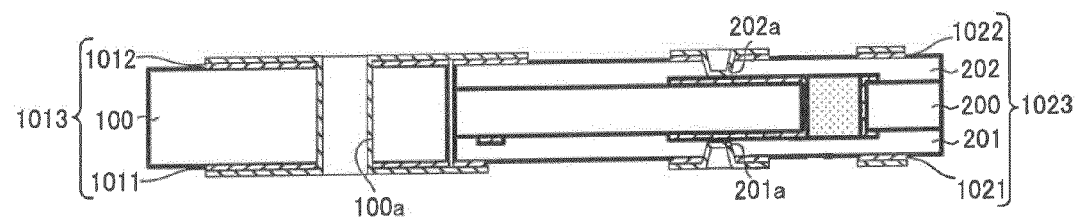
FIG. 41 is a view to illustrate a fourth step of a manufacturing method using a semi-additive method.

As shown in FIG. 40, after plating resist 131 is removed (peeled), etching is conducted. Accordingly, exposed copper foils (1011, 1012) are removed and a wiring board is completed in which first rigid wiring board 10 and second rigid wiring board 20 are electrically connected as shown in FIG. 41.

In the following, through the procedure described in the first embodiment above, insulation layers (301, 302) and wiring layers (311, 312) and others are formed on the first-surface side and the second-surface side of first rigid wiring board 10 and of second rigid wiring board 20. Accordingly, wiring board 1000 is completed as shown in FIG. 1.

Figure 42:
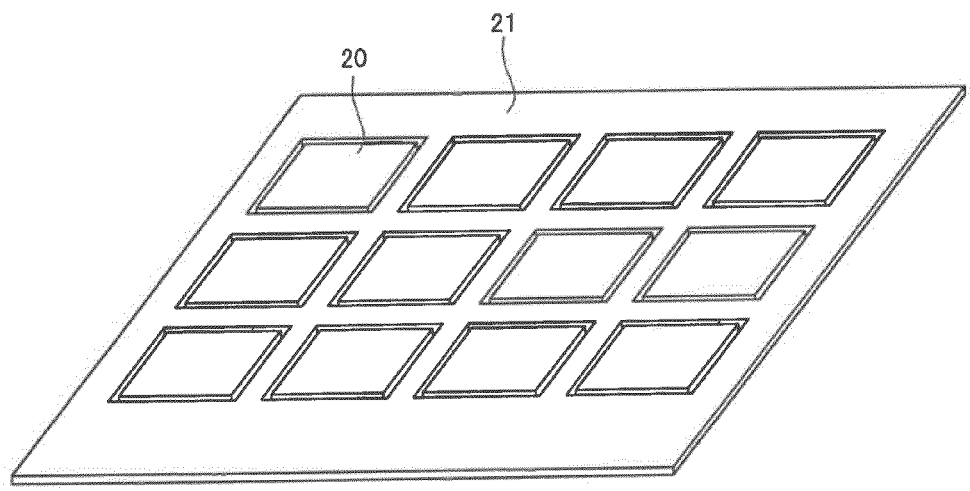
FIG. 42 is a view showing a multi-piece substrate having second rigid wiring boards.

In the first and second embodiments above, manufacturing methods are described for manufacturing a single second rigid wiring board 20. However, the present invention is not limited to such, and second rigid wiring boards 20 may be formed in multi-piece substrate 21 as shown in FIG. 42, for example.

Figure 43:
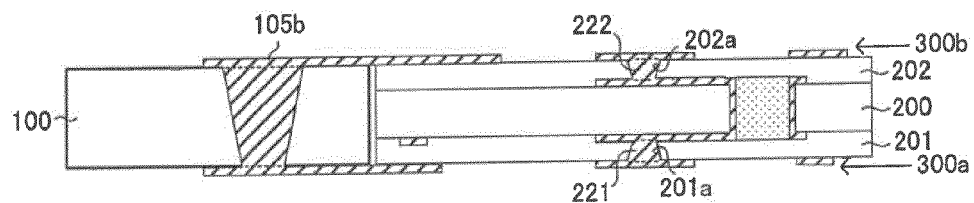
FIG. 43 is a view showing a wiring board where wiring layers are connected by a via conductor.

As shown in FIG. 3, in the first and second embodiments above, through hole (100a) is formed in first rigid wiring board 10, and wiring layer (300a) and wiring layer (300b) are electrically connected by through-hole conductor (100b) formed inside through hole (100a). However, the present invention is not limited to such, and, as shown in FIG. 43, for example, wiring layer (300a) and wiring layer (300b) may be electrically connected by via conductor (105b), for example.

Figure 44A:
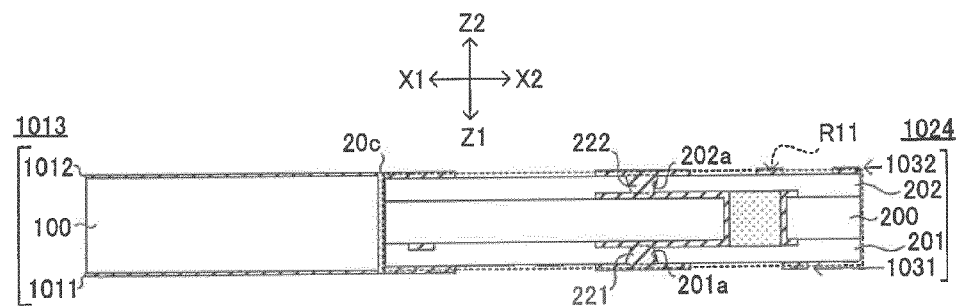
FIG. 44A is a view to illustrate a first step of a first alternative example of a method for forming wiring layers and connection portions shared by a first rigid wiring board and a second rigid wiring board.
Figure 44B:
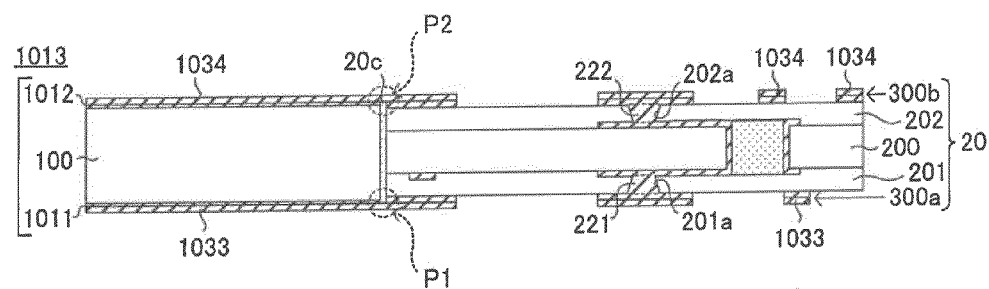
FIG. 44B is a view to illustrate a second step following the step in FIG. 44A.
Figure 44C:
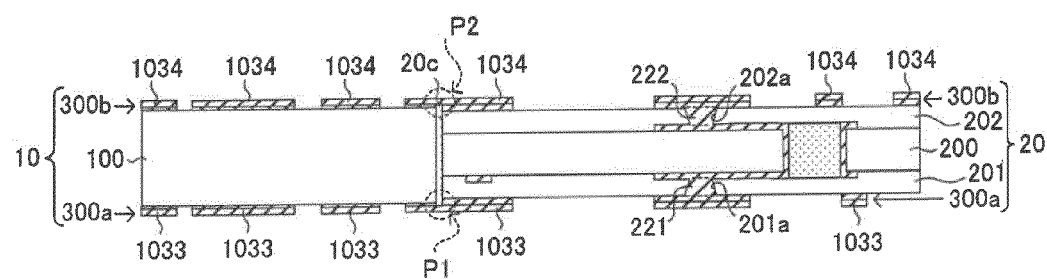
FIG. 44C is a view to illustrate a third step following the step in FIG. 44B.

Instead of the method shown previously in FIGS. 11-13), wiring layers (300a, 300b) and connection portions (P1, P2) and others may be formed by a method shown in FIGS. 44A-44C), for example.

For example, as shown in FIG. 44A), substrate 1013 (first intermediate substrate) and wiring board 1024, which has wiring layer 1031 on the first surface and wiring layer 1032 on the second surface, are prepared. Wiring board 1024 is positioned in accommodation space (R11) prepared in substrate 1013 in such a way that the first surface and the second surface (first main surface) of substrate 1013 and the first surface and the second surface (second main surface) of wiring board 1024 are set substantially flat. To preliminarily secure wiring board 1024, adhesive agent (20c) is filled in the clearance between substrate 1013 and wiring board 1024 by using a dispenser, for example.

As shown in FIG. 44B), for example, panel plating (PN plating) on substrate 1013 and pattern plating on wiring board 1024 are conducted at the same time. Accordingly, electrolytic plated films (1033, 1034) are formed, being made of copper, for example, and being contiguous from the first surface and the second surface (first main surface) of substrate 1013 to the first surface and the second surface (second main surface) of wiring board 1024. As a result, wiring layer 1031 and electrolytic plated film 1033 become wiring layer (300a), and wiring layer 1032 and electrolytic plated film 1034 become wiring layer (300b). Second rigid wiring board 20 is formed, having wiring layers (300a, 300b) on its main surfaces respectively. Also, connection portions (P1, P2) are formed between substrate 1013 and second rigid wiring board 20.

As shown in FIG. 44C), for example, the conductive layers on substrate 100 are patterned. Accordingly, first rigid wiring board 10 is formed, having wiring layers (300a, 300b) on its main surfaces respectively. The same as in the first embodiment (see FIGS. 14-18), for example, interlayer insulation layers are formed on the first surface and the second surface (first main surface) of first rigid wiring board 10 and on the first surface and the second surface (second main surface) of second rigid wiring board 20. Upper-layer wiring layers are formed on such interlayer insulation layers. Accordingly, connection portions (P1, P2) are positioned in inner layers.

Figure 45A:
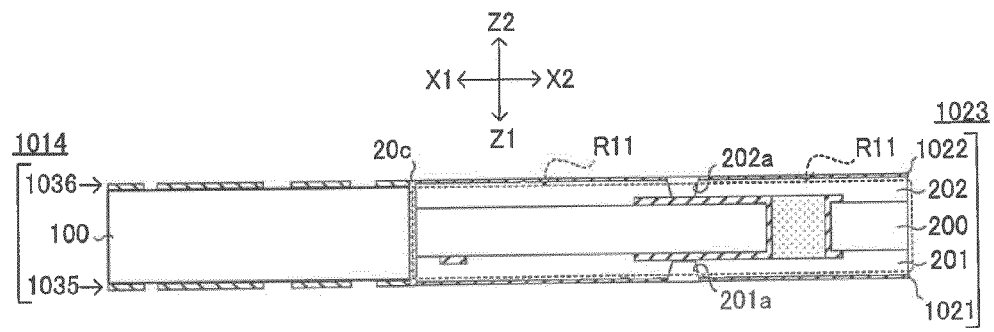
FIG. 45A is a view to illustrate a first step of a second alternative example of a method for forming wiring layers and connection portions shared by a first rigid wiring board and a second rigid wiring board.
Figure 45B:
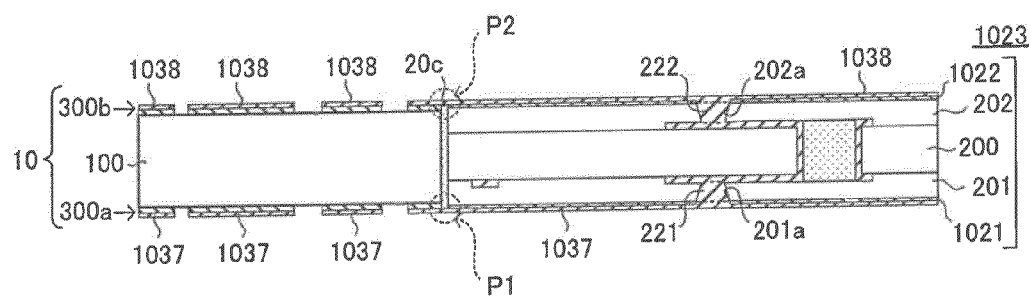
FIG. 45B is a view to illustrate a second step following the step in FIG. 45A.
Figure 45C:
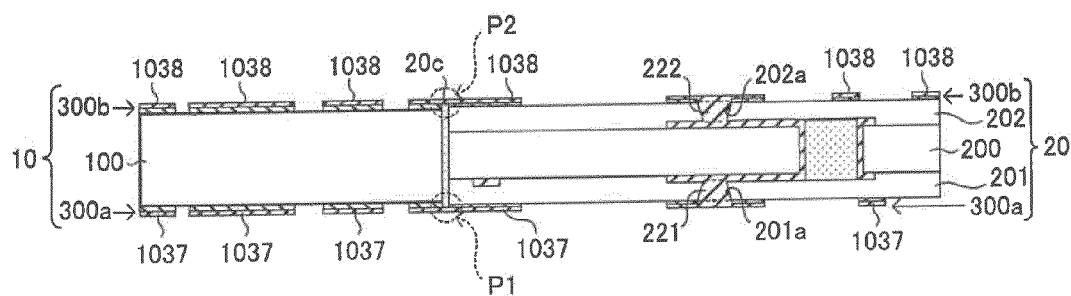
FIG. 45C is a view to illustrate a third step following the step in FIG. 45B.

Alternatively, instead of the method shown previously in FIGS. 11-13), wiring layers (300a, 300b), connection portions (P1, P2) and others may be formed by a method shown in FIGS. 45A-45C), for example.

For example, as shown in FIG. 45A), wiring board 1014, having wiring layer 1035 on the first surface and wiring layer 1036 on the second surface, and substrate 1023 (second intermediate substrate) are prepared. Substrate 1023 is positioned in accommodation space (R11) prepared in wiring board 1014 in such a way that the first surface and the second surface (first main surface) of wiring board 1014 and the first surface and the second surface (second main surface) of substrate 1023 are set substantially flat. To preliminarily secure substrate 1023, adhesive agent (20c) is filled in the clearance between wiring board 1014 and substrate 1023 by using a dispenser, for example.

As shown in FIG. 45B), for example, panel plating (PN plating) on wiring board 1014 and pattern plating on substrate 1023 are conducted at the same time. Accordingly, electrolytic plated films (1037, 1038) are formed, being made of copper, for example, and being contiguous from the first surface and the second surface (first main surface) of wiring board 1014 to the first surface and the second surface (second main surface) of substrate 1023. As a result, wiring layer 1035 and electrolytic plated film 1037 become wiring layer (300a), and wiring layer 1036 and electrolytic plated film 1038 become wiring layer (300b). First rigid wiring board 10 is formed, having wiring layers (300a, 300b) on its main surfaces respectively. Also, connection portions (P1, P2) are formed between wiring board 1014 and first rigid wiring board 10.

As shown in FIG. 45C), for example, the conductive layers on insulation layers (201, 202) are patterned. Accordingly, second rigid wiring board 20 is formed, having wiring layers (300a, 300b) on its main surfaces respectively. The same as in the first embodiment (see FIGS. 14-18), for example, interlayer insulation layers are formed on the first surface and the second surface (first main surface) of first rigid wiring board 10 and on the first surface and the second surface (second main surface) of second rigid wiring board 20. Upper-layer wiring layers are formed on such interlayer insulation layers. Accordingly, connection portions (P1, P2) are positioned in inner layers.

In the first and second embodiments above, the method for forming accommodation space (R11) is not limited specifically. Accommodation space (R11) may also be formed by etching or the like, for example.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
   a core substrate comprising a first rigid wiring board comprising a resin substrate and a second rigid wiring board comprising a resin substrate;
   a wiring layer formed on a surface of the core substrate and having a connection portion such that the connection portion of the wiring layer is connecting the first rigid wiring board and the second rigid wiring board in the core substrate; and
   an interlayer insulation layer formed on the surface of the core substrate and the wiring layer formed on the surface of the core substrate such that the interlayer insulation layer is extending over the first rigid wiring board and the second rigid wiring board, wherein the wiring layer includes a single wiring layer forming a wiring pattern on the first rigid wiring board, a wiring pattern on the second rigid wiring board and the connection portion of the wiring layer, the first rigid wiring board and the second rigid wiring board are positioned such that the surfaces of the first rigid wiring board and the second rigid wiring board are set at substantially a same level and form the surface of the core substrate.

2. The wiring board according to claim 1, wherein the first rigid wiring board and the second rigid wiring board are positioned such that the first rigid wiring board and the second rigid wiring board form a clearance between the first rigid wiring board and the second rigid wiring board, the clearance between the first rigid wiring board and the second rigid wiring board has a resin filling a space formed by the clearance such that at least a portion of the connection portion is positioned on the resin.

3. The wiring board according to claim 1, further comprising:
a second wiring layer formed on a second surface of the core substrate on an opposite side with respect to the surface of the core layer; and
a second interlayer insulation layer formed on the second surface of the core substrate and the second wiring layer formed on the second surface of the core substrate such that the second interlayer insulation layer is extending over the first rigid wiring board and the second rigid wiring board,
wherein the second wiring layer has a connection portion such that the connection portion of the second wiring layer is connecting the first rigid wiring board and the second rigid wiring board in the core substrate.

4. The wiring board according to claim 3, wherein the single wiring layer of the wiring layer is a patterned metal film.

5. The wiring board according to claim 3, wherein the single wiring layer of the wiring layer is a patterned plated film.

6. The wiring board according to claim 3, wherein the first rigid wiring board is a printed wiring board, and the second rigid wiring board is a printed wiring board.

7. The wiring board according to claim 3, wherein the single wiring layer of the wiring layer is a patterned metal film, and the second wiring layer includes a single wiring layer comprising a patterned metal film.

8. The wiring board according to claim 3, wherein the single wiring layer of the wiring layer is a patterned plated film, and the second wiring layer includes a single wiring layer comprising a patterned plated film.

9. The wiring board according to claim 3, wherein the second wiring layer includes a single wiring layer forming a wiring pattern on the first rigid wiring board, a wiring pattern on the second wiring board and the connection portion of the second wiring layer.

10. The wiring board according to claim 1, wherein an existing density of conductors in the second rigid wiring board is higher than an existing density of conductors in the first rigid wiring board.

11. The wiring board according to claim 1, wherein the second rigid wiring board is a multilayer wiring board having a plurality of wiring layers including a portion of the wiring layer, and a total number of the wiring layers in the second rigid wiring board is greater than a total number of wiring layers in the first rigid wiring board including the wiring layer formed on the surface of the core substrate.

12. The wiring board according to claim 1, wherein the interlayer insulation layer has a plurality of via conductors in the interlayer insulation layer directly on the second rigid wiring board in a number is greater than a number of a plurality of via conductors in the interlayer insulation layer directly on the first rigid wiring board.

13. The wiring board according to claim 1, wherein the second rigid wiring board is a multilayer wiring board having a plurality of wiring layers including a portion of the wiring layer formed on the surface of the core substrate, and a thickness of at least one wiring layer in the second rigid wiring board is set to be a same as or less than a thickness of a wiring layer in the first rigid wiring board.

14. The wiring board according to claim 1, further comprising a second wiring layer formed on a second surface of the core substrate on an opposite side with respect to the surface of the core layer, wherein the second wiring layer has a connection portion such that the connection portion of the second wiring layer is connecting the first rigid wiring board and the second rigid wiring board in the core substrate.

15. The wiring board according to claim 1, wherein the single wiring layer of the wiring layer is a patterned metal film.

16. The wiring board according to claim 1, wherein the single wiring layer of the wiring layer is a patterned plated film.

17. The wiring board according to claim 1, wherein the first rigid wiring board is a printed wiring board, and the second rigid wiring board is a printed wiring board.

18. The wiring board according to claim 1, further comprising a second wiring layer formed on a second surface of the core substrate on an opposite side with respect to the surface of the core layer, wherein the second wiring layer has a connection portion such that the connection portion of the second wiring layer is connecting the first rigid wiring board and the second rigid wiring board in the core substrate, the single wiring layer of the wiring layer is a patterned metal film, and the second wiring layer includes a single wiring layer comprising a patterned metal film.

19. The wiring board according to claim 1, further comprising a second wiring layer formed on a second surface of the core substrate on an opposite side with respect to the surface of the core layer, wherein the second wiring layer has a connection portion such that the connection portion of the second wiring layer is connecting the first rigid wiring board and the second rigid wiring board in the core substrate, the single wiring layer of the wiring layer is a patterned plated film, and the second wiring layer includes a single wiring layer comprising a patterned plated film.

20. The wiring board according to claim 1, further comprising a second wiring layer formed on a second surface of the core substrate on an opposite side with respect to the surface of the core layer, wherein the second wiring layer has a connection portion such that the connection portion of the second wiring layer is connecting the first rigid wiring board and the second rigid wiring board in the core substrate, and the second wiring layer includes a single wiring layer forming a wiring pattern on the first rigid wiring board, a wiring pattern on the second wiring board and the connection portion of the second wiring layer.

* * * * *